(12) United States Patent
Luo et al.

(10) Patent No.: US 12,557,275 B2
(45) Date of Patent: Feb. 17, 2026

(54) INTEGRATED ASSEMBLIES AND METHODS OF FORMING INTEGRATED ASSEMBLIES

(71) Applicant: Micron Technology, Inc., Boise, ID (US)

(72) Inventors: Shuangqiang Luo, Boise, ID (US); Lifang Xu, Boise, ID (US); Indra V. Chary, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 433 days.

(21) Appl. No.: 18/207,499

(22) Filed: Jun. 8, 2023

(65) Prior Publication Data

US 2023/0328975 A1     Oct. 12, 2023

Related U.S. Application Data

(62) Division of application No. 17/142,804, filed on Jan. 6, 2021, now Pat. No. 11,716,841.

(51) Int. Cl.
| | |
|---|---|
| *H10B 43/27* | (2023.01) |
| *H10B 41/10* | (2023.01) |
| *H10B 41/27* | (2023.01) |
| *H10B 41/40* | (2023.01) |

(Continued)

(52) U.S. Cl.
CPC ............. *H10B 41/27* (2023.02); *H10B 41/10* (2023.02); *H10B 41/40* (2023.02); *H10B 43/10* (2023.02); *H10B 43/27* (2023.02); *H10B 43/40* (2023.02)

(58) Field of Classification Search
CPC ................. H10B 43/27; H10B 43/20
See application file for complete search history.

(56) References Cited

U.S. PATENT DOCUMENTS

| | | |
|---|---|---|
| 10,256,248 B2 | 4/2019 | Lu et al. |
| 10,614,862 B2 | 4/2020 | Russo |
| 2013/0336038 A1 | 12/2013 | Cernea et al. |

(Continued)

FOREIGN PATENT DOCUMENTS

| | | |
|---|---|---|
| CN | 110010616 | 7/2019 |
| CN | 202210001489.9 | 7/2025 |
| EP | 3420591 | 1/2019 |

*Primary Examiner* — Christopher A Johnson
(74) *Attorney, Agent, or Firm* — Wells St. John P.S.

(57) ABSTRACT

Some embodiments include an integrated assembly having a first memory region, a second memory region, and an intermediate region between the memory regions. A stack extends across the memory regions and the intermediate region. The stack includes alternating conductive levels and insulative levels. Channel-material-pillars are arranged within the memory regions. Memory-block-regions extend longitudinally across the memory regions and the intermediate region. Staircase regions are within the intermediate region. Each of the staircase regions laterally overlaps two of the memory-block-regions. First panel regions extend longitudinally across at least portions of the staircase regions. Second panel regions extend longitudinally and provide lateral separation between adjacent memory-block-regions. The second panel regions are of laterally different dimensions than the first panel regions and/or are compositionally different than the first panel regions. Some embodiments include methods of forming integrated assemblies.

20 Claims, 21 Drawing Sheets

(51) Int. Cl.
  *H10B 43/10* (2023.01)
  *H10B 43/40* (2023.01)

(56) References Cited

U.S. PATENT DOCUMENTS

| | | |
|---|---|---|
| 2019/0348435 A1 | 11/2019 | Nagata et al. |
| 2020/0312865 A1 | 10/2020 | Ge et al. |
| 2021/0265389 A1 | 8/2021 | Kim et al. |
| 2022/0115322 A1* | 4/2022 | Zhang ............... H01L 21/76816 |

* cited by examiner

INTEGRATED ASSEMBLIES AND METHODS OF FORMING INTEGRATED ASSEMBLIES

RELATED PATENT DATA

This patent resulted from a divisional of U.S. patent application Ser. No. 17/142,804 file Jan. 6, 2021, which is hereby incorporated herein by reference.

TECHNICAL FIELD

Methods of forming integrated assemblies (e.g., integrated memory devices). Integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a schematic diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" (sub-block) of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select-device (e.g., source-side select gate, SGS) 210 and a drain-select device (e.g., drain-side select gate, SGD) 212. Each source-select-device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 4.

A source of each source-select-device 210 is connected to a common source line 216. The drain of each source-select-device 210 is connected to the source of the first charge-storage transistor 208 of the corresponding NAND string 206. For example, the drain of source-select-device $210_1$ is connected to the source of charge-storage transistor $208_1$ of the corresponding NAND string $206_1$. The source-select-devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It is desired to develop improved methods of forming integrated memory (e.g., NAND memory). It is also desired to develop improved memory devices.

DETAILED DESCRIPTION OF THE ILLUSTRATED EMBODIMENTS

Some embodiments include methods of forming integrated assemblies. The assemblies may have an intermediate region between a pair of memory regions. First panel structures may be formed within the intermediate region to provide structural support. Subsequently, slits may be formed to extend into the memory regions and into the intermediate region, with portions of the slits within the memory regions spacing memory blocks from one another. The slits may be utilized to enable access to sacrificial material during gate-replacement methodology. The slits may be filled with one or more materials to form second panel structures. Example embodiments are described with reference to FIGS. 5-17.

Figure 1:
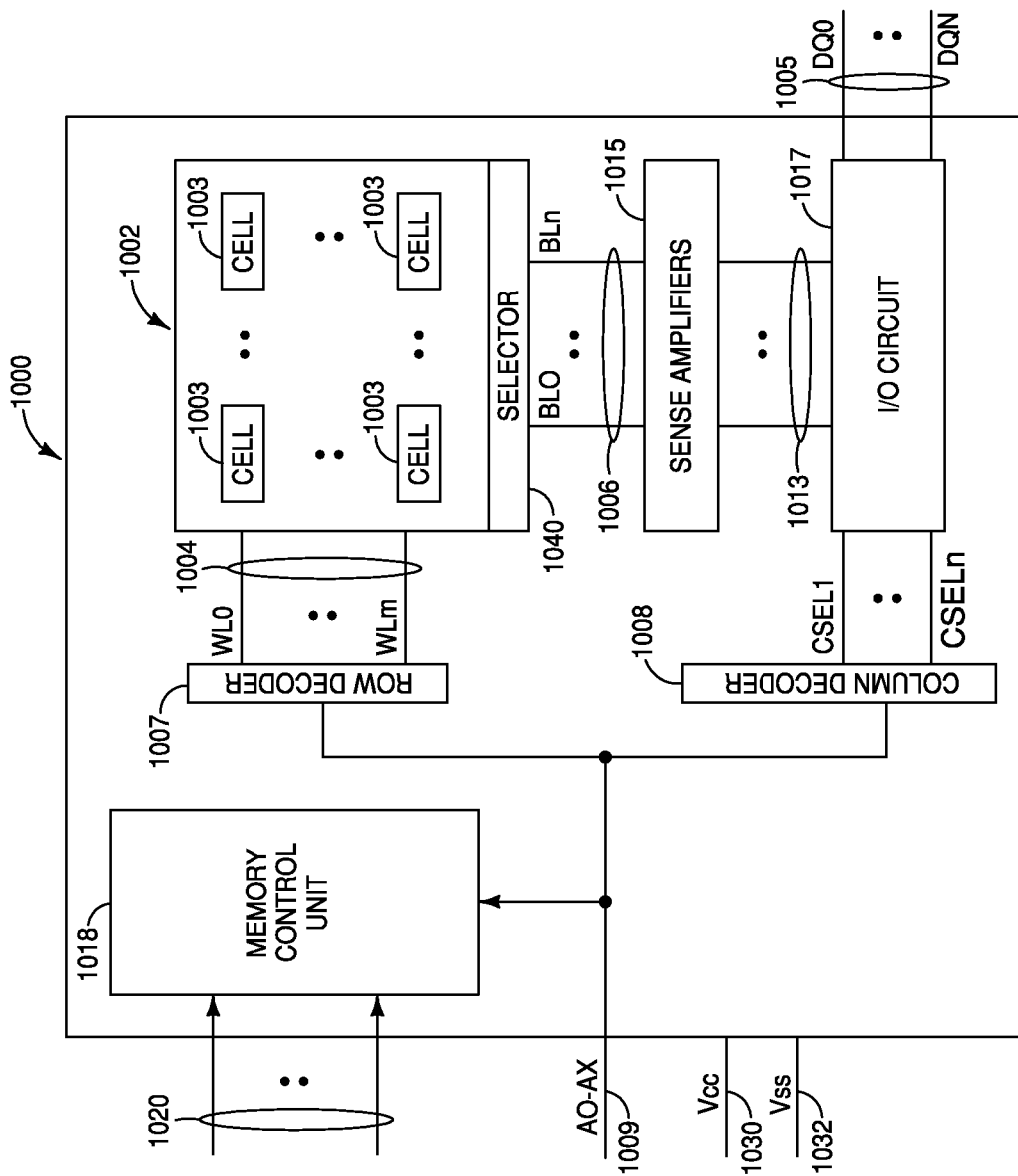
FIG. 1 shows a block diagram of a prior art memory device having a memory array with memory cells.
Figure 2:
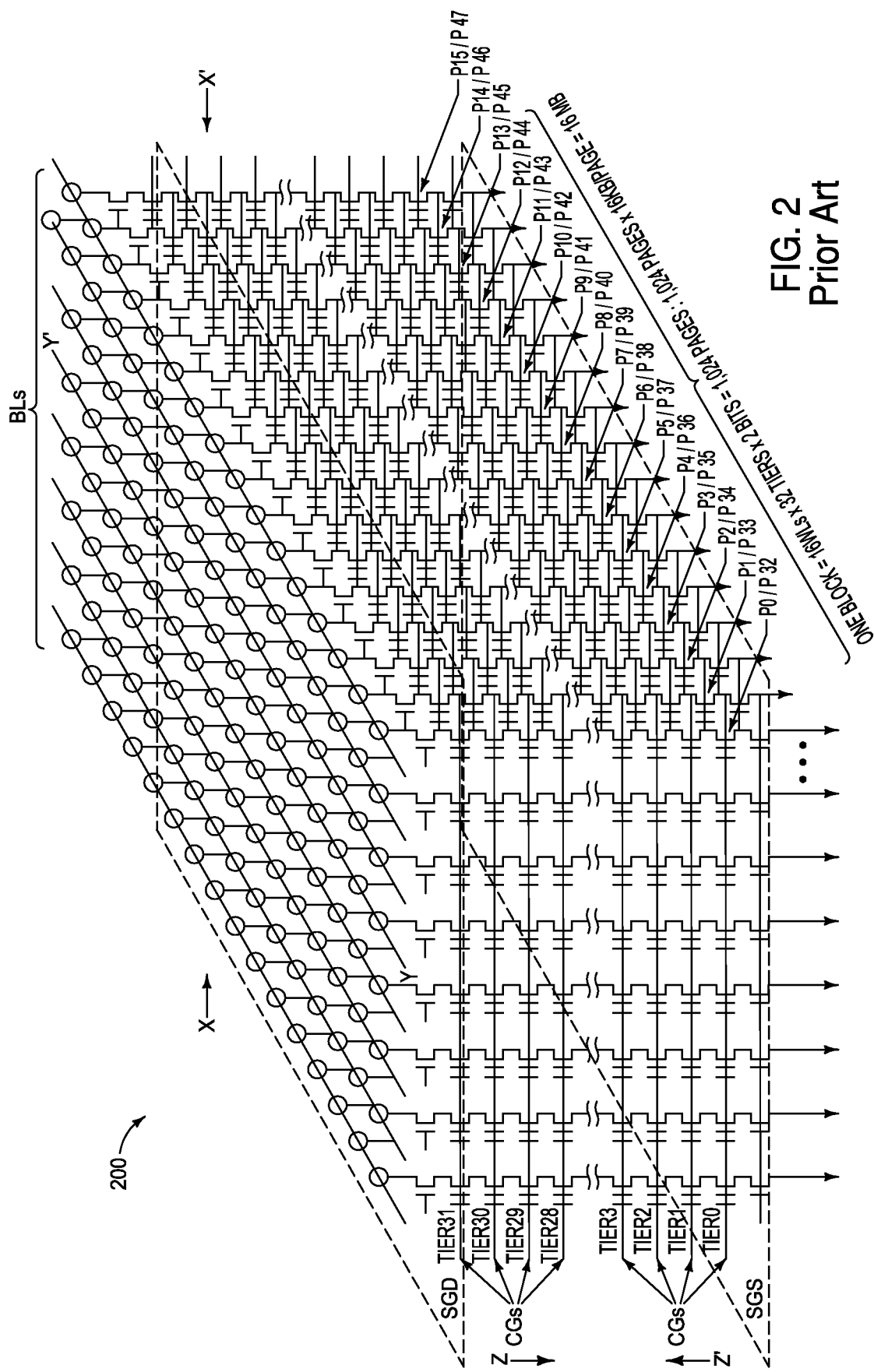
FIG. 2 shows a schematic diagram of the prior art memory device of FIG. 1 in the form of a 3D NAND memory device.
Figure 3:
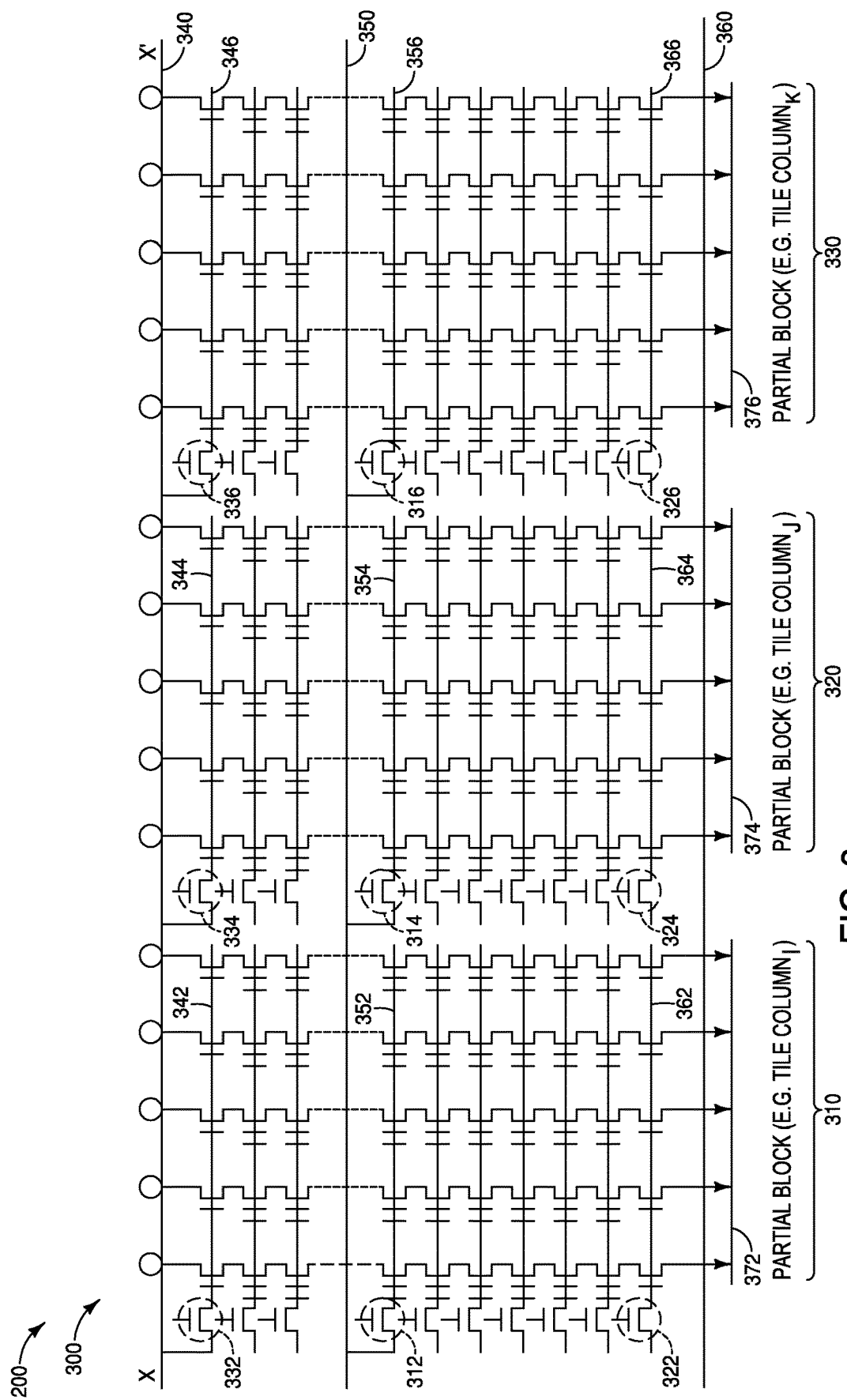
FIG. 3 shows a cross-sectional view of the prior art 3D NAND memory device of FIG. 2 in an X-X' direction.
Figure 4:
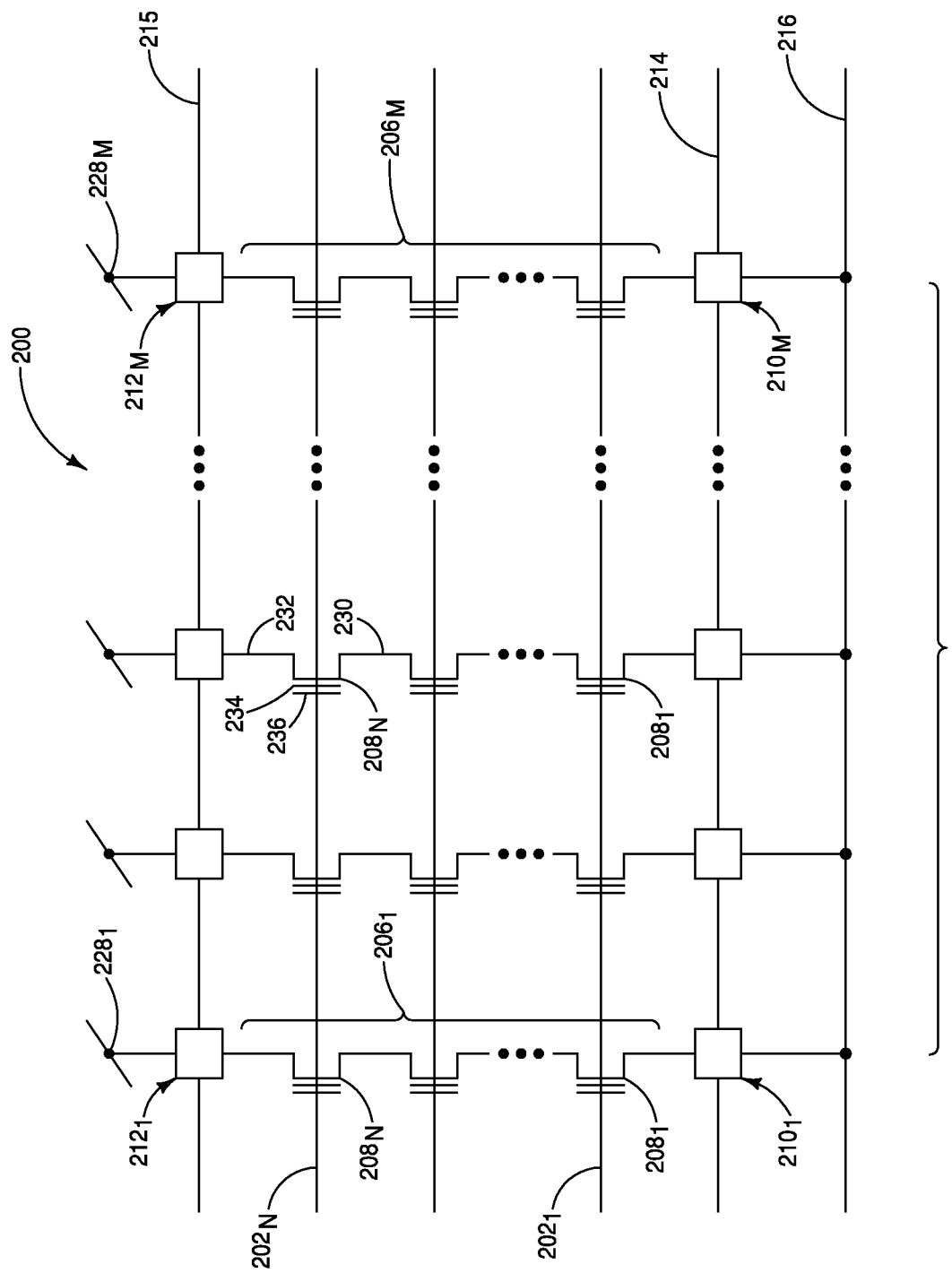
FIG. 4 is a schematic diagram of a prior art NAND memory array.
Figure 5:
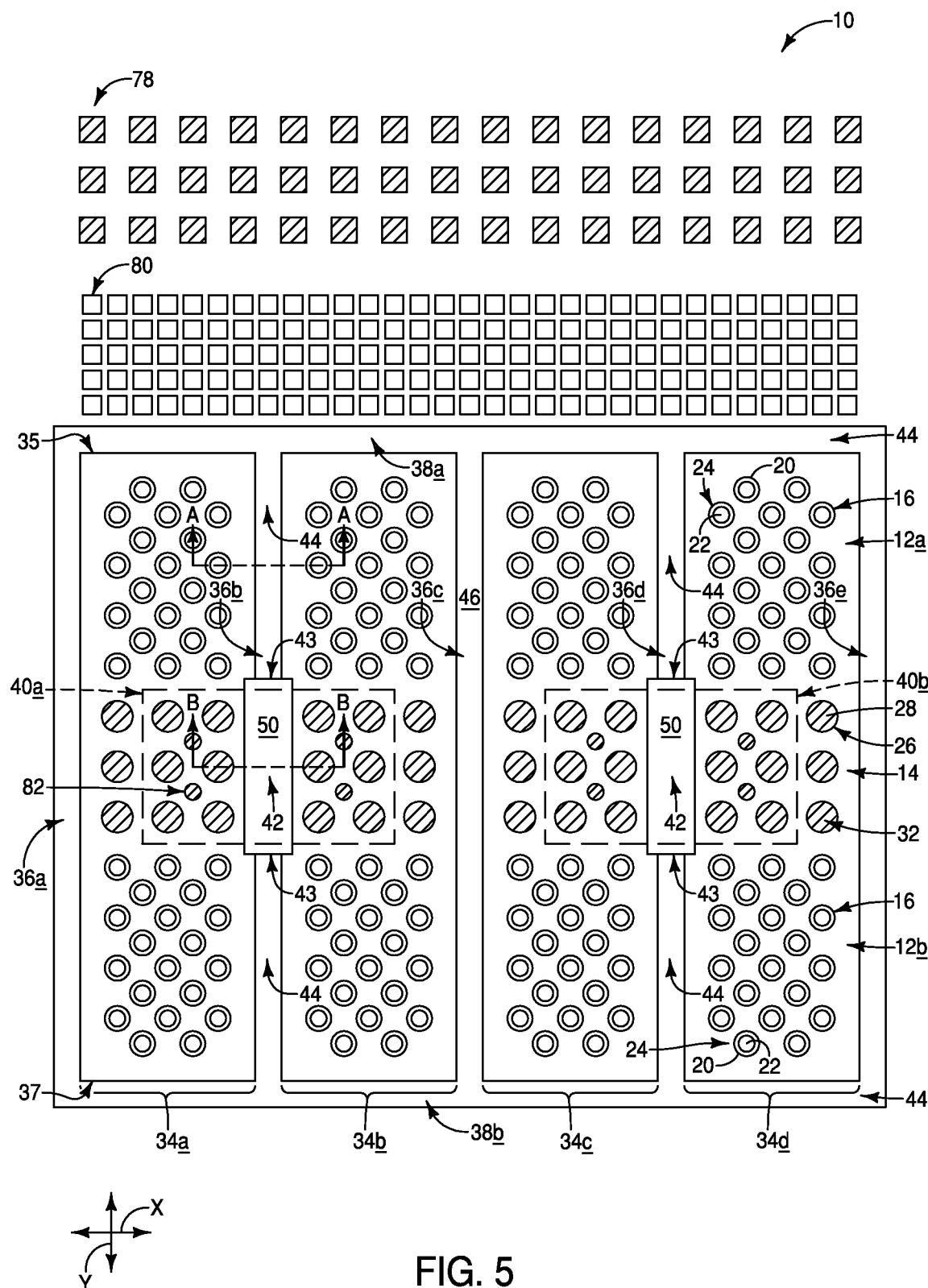
FIGS. 5-5B are a diagrammatic top-down view (FIG. 5) and a pair of diagrammatic cross-sectional side views (FIGS. 5A and 5B) of regions of an example integrated assembly illustrating an example embodiment. The cross-sectional side views of FIGS. 5A and 5B are along the lines A-A and B-B of FIG. 5, respectively.
Figure 5A:
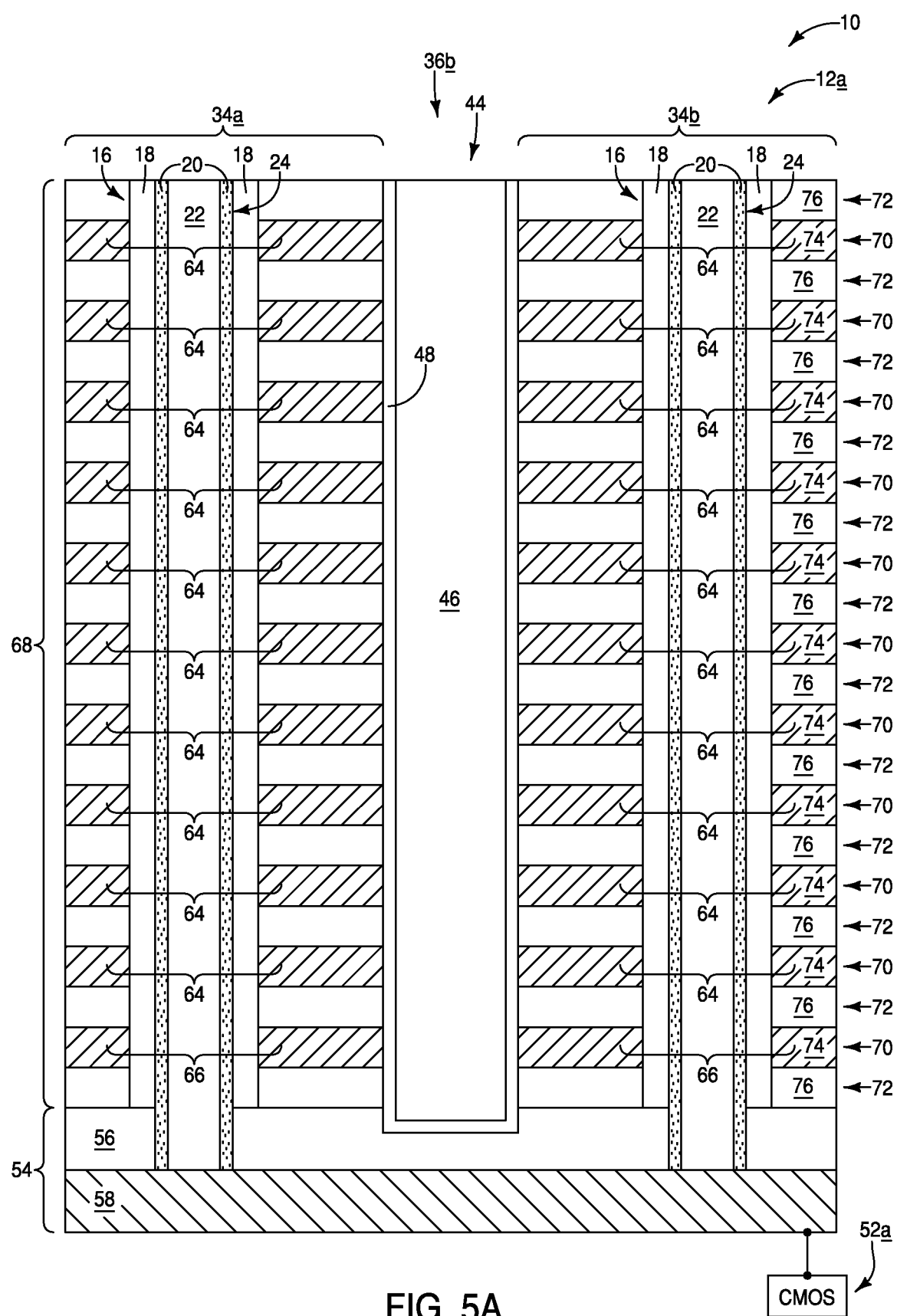
Figure 5B:
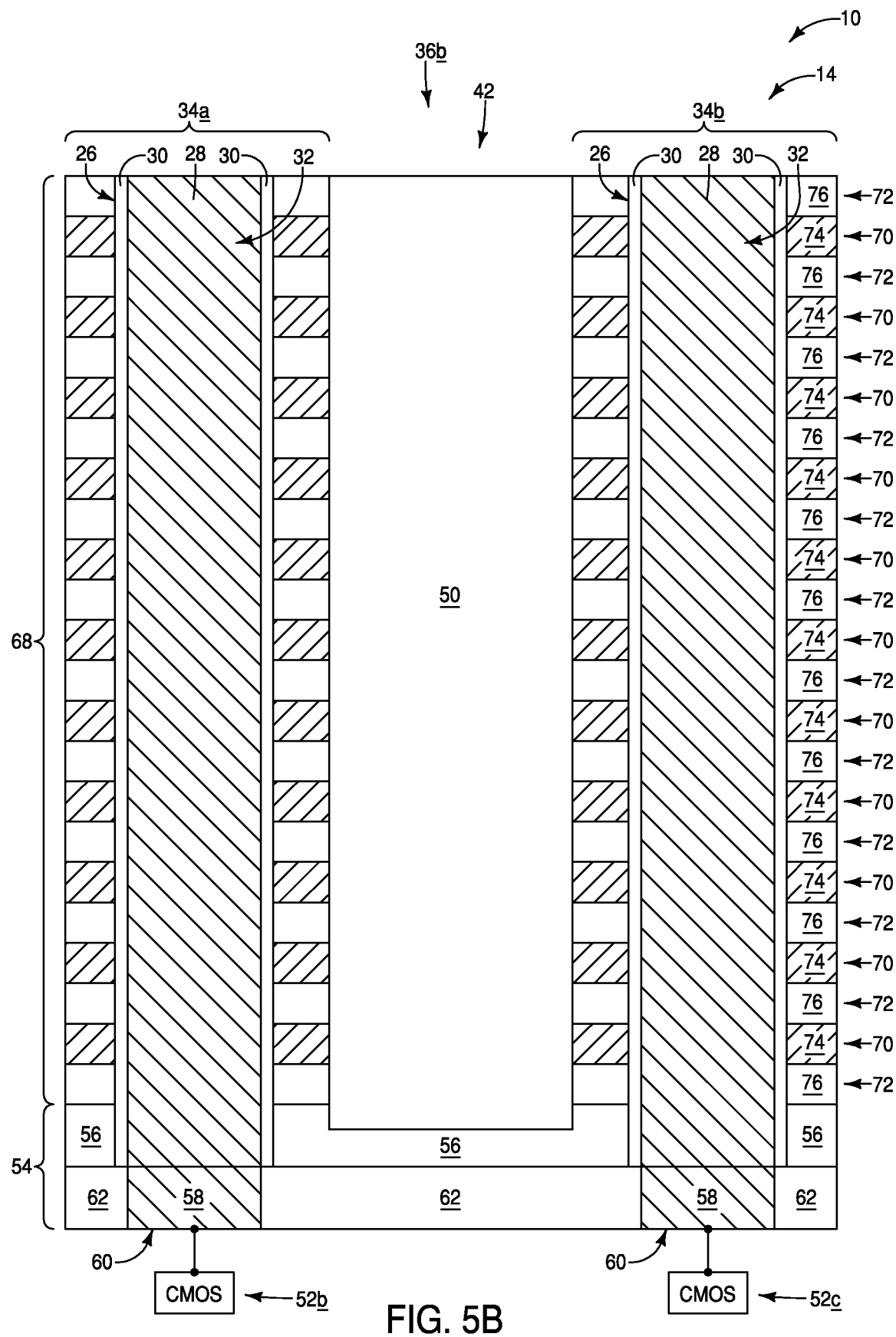

FIG. 5 shows a top-down view along several example regions of an example integrated assembly 10. The illustrated regions of the assembly 10 include a pair of memory regions (memory array regions) 12a and 12b (Array-1 and Array-2), and include an intermediate region 14 between the memory regions. In some embodiments, the memory regions 12a and 12b may be referred to as first regions which are laterally displaced relative to one another (laterally offset from one another), and the intermediate region 14 may be referred to as another region (or as a second region) which is between the laterally-displaced (laterally-offset) first regions. It is noted that FIGS. 5A and 5B show cross-sectional side-views within the memory region 12a and the intermediate region 14, respectively. The view of FIG. 5A is along the line A-A of FIG. 5, and the view of FIG. 5B is along the line B-B of FIG. 5. The views of FIGS. 5A and 5B diagrammatically illustrate example structures represented in the top-down view of FIG. 5, but are not provided to the same scale as FIG. 5.

FIG. 5 shows that cell-material-pillars 16 are arranged within the memory regions 12a and 12b. The pillars 16 may be substantially identical to one another, with the term "substantially identical" meaning identical to within reasonable tolerances of fabrication and measurement. The pillars 16 may be configured in a tightly-packed arrangement within each of the memory regions 12a and 12b, such as, for example, a hexagonal close packed (HCP) arrangement. There may be hundreds, thousands, millions, hundreds of thousands, etc., of the pillars 16 arranged within each of the memory regions 12a and 12b. The pillars 16 may have any suitable shape in the top-down view of FIG. 5. Although the pillars 16 are shown to be circular in FIG. 5, in other embodiments they may be elliptical, polygonal, etc.

FIG. 5A shows that each of the pillars 16 comprises an outer region 18 containing memory cell materials, a channel material 20 adjacent the outer region 18, and an insulative material 22 surrounded by the channel material 20. Stippling is provided within the channel material 20 of FIG. 5A to assist the reader in identifying the channel material.

The cell materials within the region 18 may comprise tunneling material, charge-storage material and charge-blocking material. The tunneling material (also referred to as gate dielectric material) may comprise any suitable composition(s); and in some embodiments may comprise one or more of silicon dioxide, aluminum oxide, hafnium oxide, zirconium oxide, etc. The charge-storage material may comprise any suitable composition(s); and in some embodiments may comprise floating gate material (e.g., polysilicon) or charge-trapping material (e.g., one or more of silicon nitride, silicon oxynitride, conductive nanodots, etc.). The charge-blocking material may comprise any suitable composition(s); and in some embodiments may comprise one or more of silicon dioxide, aluminum oxide, hafnium oxide, zirconium oxide, etc.

The channel material 20 comprises semiconductor material. The semiconductor material may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material may comprise, consist essentially of, or consist of appropriately-doped silicon.

The channel material 20 may be considered to be configured as channel-material-pillars 24. In the illustrated embodiment, the channel-material-pillars 24 are configured as annular rings in the top-down view of FIG. 5, with such annular rings surrounding the insulative material 22. Such configuration of the channel-material-pillars may be considered to correspond to a "hollow" channel configuration, with the insulative material 22 being provided within the hollows of the channel-material-pillars. In other embodiments, the channel material 22 may be configured as solid pillars. In some embodiments, the channel-material-pillars within the memory region 12a may be referred to as first channel-material-pillars, and the channel-material-pillars within the memory region 12b may be referred to as second channel-material pillars. The channel-material-pillars may be arranged within the first and second memory regions 12a and 12b in any suitable configurations. In some embodiments, they may be arranged in tightly-packed configurations, such as, for example, hexagonal-close-packed (HCP) configurations.

The outer regions 18 of the cell materials would be annular rings in the top-down view of FIG. 5, but are not shown in FIG. 5 to simplify the drawing.

The insulative material 22 of FIGS. 5 and 5A may comprise any suitable composition(s), and in some embodiments may comprise, consist essentially of, or consist of silicon dioxide.

Posts 26 are arranged within the intermediate region 14. FIG. 5B shows that each of the posts 26 includes a conductive material 28 laterally surrounded by an insulative material 30. The insulative material 30 is not shown in the top-down view of FIG. 5 to simplify the drawing.

The posts 26 may be arranged in any suitable configuration, and may or may not be the same size and composition as one another. The posts 26 may have any suitable shape in the top-down view of FIG. 5. Thus, although the posts 26 are shown to be circular in FIG. 5, in other embodiments they may be elliptical, polygonal, etc.

The conductive material 28 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 28 may comprise one or more of tungsten, titanium nitride and tungsten nitride. For instance, the conductive material 28 may comprise a conductive liner comprising one or both of titanium nitride and tungsten nitride along the insulative liner 30, and may comprise a tungsten fill laterally surrounded by the conductive liner.

The insulative material 30 is configured as insulative rings (or alternatively, insulative liners) surrounding the conductive posts. The material 30 may comprise any suitable composition(s), and in some embodiments may comprise, consist essentially of, or consist of silicon dioxide.

In some embodiments, the conductive material 28 of the posts 26 may be considered to be configured as conductive posts 32. Such conductive posts may be "live", and accordingly may be utilized as electrical interconnects. Alternatively, the posts may be "dummy", and may be utilized simply for providing structural support. There may be hundreds, thousands, millions, etc., of the posts 26 provided within the intermediate region 14.

The intermediate region 14 may comprise numerous regions associated with integrated memory, including, for example, staircase regions, crest regions, bridging regions, etc. If the conductive posts 32 are live posts, such may be utilized for interconnecting components associated with the memory regions 12a and 12b to circuitry beneath the illustrated region of the integrated assembly 10. For instance, the conductive posts may be utilized for connecting bitlines to sensing circuitry (e.g., sense-amplifier-circuitry), for connecting SGD devices to control circuitry, etc.

FIG. 5 shows memory-block-regions 34a-34d extending longitudinally across the memory regions 12a and 12b, and across the intermediate region 14. In the illustrated embodiment, the longitudinal direction of the memory-block-regions is an illustrated y-axis direction, which may be alternatively referred to as a first direction. The block regions 34a-d may be analogous to the memory blocks described above in the "Background" section of this disclosure.

Panels 36a-36e extend longitudinally along lateral edges of the memory-block-regions 34a-34d, and panels 38a and 38b extend laterally (i.e., along an illustrated x-axis direction, or second direction) along ends of the memory-block-regions 34a-34d. In some embodiments, the longitudinally-extending panels 36a-36e may be referred to as first panels, and the laterally-extending panels 38a and 38b may be referred to as second panels. In some embodiments, each of the memory-block-regions 34 may be considered to include a first edge region along a terminal edge of the first memory region 12a, and to include a second edge region 37 along a terminal edge of the second memory region 12b. The laterally-extending panels 38a and 38b may be considered to be along the first and second edge regions 35 and 37, respectively.

FIG. 5 diagrammatically shows staircase regions (stadium regions) 40a and 40b, with dashed lines being utilized to indicate approximate boundaries of the staircase regions. The staircase regions 40 are within the intermediate region 14. Notably, each of the staircase regions 40 laterally overlaps two of the memory-block-regions 34 (e.g., the staircase region 40a laterally overlaps the memory-block-regions 34a and 34b). The memory-block-regions overlapping portions of a staircase region may be considered to be associated with the staircase region. Thus, the memory-block-regions 34a and 34b may be considered to be associated with the staircase region 40a, and the memory-block-regions 34c and 34d may be considered to be associated with the staircase region 40b.

The longitudinally-extending panels 36 may be considered to comprise a first set of the longitudinally-extending panels (which may be referred to as first longitudinally-extending panels) which extend across the staircase regions 40. In the shown embodiment, the first longitudinally-extending panels are the panels 36b and 36d.

The longitudinally-extending panels 36 may be considered to comprise a second set the of longitudinally-extending panels (which may be referred to as second longitudinally-extending panels) which extend laterally between the staircase regions 40, and which do not cross the staircase regions. In the shown embodiment, the second longitudinally-extending panels are the panels 36a, 36c and 36e.

The first panels 36b and 36d include first panel regions 42 and second panel regions 44, with the first panel regions 42 differing from the second panel regions 44 in one or both of composition and thickness. In the shown embodiment the first panel regions 42 are laterally wider (laterally thicker) than the second panel regions 44. Generally, the first panel regions 42 will be at least as wide as the second panel regions 44 along the interfaces 43 where edges of the first and second panel regions 42 and 44 abut to one another (i.e., are directly adjacent to one another).

The first panel regions 42 may extend entirely across the staircase regions 40 along the longitudinal (y-axis) direction, as shown in FIG. 5. The first panel regions 42 may provide structural support during the removal of sacrificial materials (as discussed below with reference to FIGS. 16A and 16B), and may also reduce or eliminate problematic block-bending (i.e., warping, twisting, and/or other undesired mechanical shift of the memory-block-regions 34) during fabrication and/or use of the integrated assembly 10. It may be desirable for the first panel regions 42 to extend entirely across the staircase regions 40 along the longitudinal direction. However, it is to be understood that in some embodiments it may be suitable for the first panel regions 42 to extend only partially across the staircase regions 40 along the longitudinal direction rather than entirely across the staircase regions.

The first panel regions 42 are laterally between the memory-block-regions 34 associated with an individual staircase region 40. For instance, one of the panel regions 42 is laterally between the memory-block-regions 34a and 34b associated with the staircase region 40a.

The second panel regions 44 of the first panels 36b and 36d provide lateral separation between neighboring memory-block-regions (e.g., the second panel regions 44 of the panel 36b provide lateral separation between the neighboring memory-block-regions 34a and 34b).

In the shown embodiment, the second longitudinally-extending panels 36a, 36c and 36e include only the second panel regions 44, and the laterally-extending panels 38a and 38b include only the second panel regions 44.

FIGS. 5A and 5B show that the panel regions 42 and 44 are of different compositions relative to one another. Specifically, the panel region 44 is a laminate of two different compositions 46 and 48, and the panel region 42 comprises only a single homogeneous composition 50.

In some embodiments, the composition 46 may comprise, consist essentially, or consist of one or more of silicon (e.g., polycrystalline silicon, amorphous silicon, etc.), germanium, silicon dioxide, metal, etc. In some embodiments, the composition 46 may comprise undoped semiconductor material, such as, for example, undoped silicon. The term "undoped" doesn't necessarily mean that there is absolutely no dopant present within the semiconductor material, but rather means that any dopant within such semiconductor material is present to an amount generally understood to be insignificant. For instance, undoped silicon may be understood to comprise a dopant concentration of less than about $10^{16}$ atoms/cm$^3$, less than about $10^{15}$ atoms/cm$^3$, etc., depending on the context.

In some embodiments, the composition 48 may comprise, consist essentially, or consist of silicon nitride.

In some embodiments, the composition 50 may comprise, consist essentially, or consist of silicon dioxide.

In some embodiments, the panel regions 42 and 44 may be the same composition as one another.

In some embodiments, the laminate of the panel region 44 may comprise more than two different materials.

In some embodiments, the material 48 of the panel region 44 (FIG. 5A) may be considered to be a liner configured as an upwardly-opening-container-shape, and the material 46 may be considered to be a fill material within such upwardly-opening-container-shape. The liner of material 48 is not shown in the top-down view of FIG. 5 to simplify the drawing.

FIG. 5A shows that the assembly 10 includes a source structure 54 comprising a first composition 56 over a second composition 58. The first composition 56 may, for example, comprise silicon (and/or other semiconductor material) heavily doped with suitable conductivity-enhancing dopant (e.g., phosphorus, arsenic, etc.). The second composition 58 may comprise any suitable conductive material; such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the second composition 58 may comprise, consist essentially of, or consist of tungsten silicide.

The source structure 54 is shown to be coupled with logic circuitry (e.g., CMOS) 52a provided beneath the source structure. The logic circuitry 52a may include, for example, control circuitry suitable for coupling with the source structure 54 and controlling electrical flow along the source structure during read/write operations of memory cells within the memory regions 12a and 12b. The source structure 54 may be analogous to the source structures described above with reference to the prior art of FIGS. 1-4.

The logic circuitry (e.g., CMOS) may be supported by a semiconductor material (not shown). Such semiconductor material may, for example, comprise, consist essentially of, or consist of monocrystalline silicon (Si). The semiconductor material may be referred to as a semiconductor base or as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. The configurations described herein may be referred to as integrated configurations supported by a semiconductor substrate, and accordingly may be considered to be integrated assemblies.

FIG. 5B shows that the conductive material 58 may be configured as islands 60 in the intermediate region 14. Such islands are laterally spaced from one another by insulative material 62. The insulative material 62 may comprise any suitable composition(s), and in some embodiments may comprise, consist essentially of, or consist of silicon dioxide.

FIG. 5B shows the logic circuitry (e.g., CMOS) including components 52b and 52c which are coupled with the conductive material 28 of the conductive posts 32 through the conductive islands 60. The components 52b and 52c may correspond to, for example, control circuitry and/or sensing circuitry (e.g., sense-amplifier-circuitry, driver circuitry, etc.).

A stack 68 is formed over the composition 56, as shown in FIGS. 5A and 5B. The stack 68 has alternating first and second levels 70 and 72. The first levels 70 comprise a conductive material 74 and the second levels 72 comprise an insulative material 76. Although the conductive material 74 is shown to entirely fill the first levels 70, in other embodiments at least some of the material provided within the first levels 70 may be insulative material (e.g., dielectric-blocking material).

The conductive material 74 may comprise any suitable composition(s); and in some embodiments may comprise a tungsten core at least partially surrounded by titanium nitride. The dielectric-barrier material, if present, may comprise any suitable composition(s); and in some embodiments may comprise one or more of aluminum oxide, hafnium oxide, zirconium oxide, etc.

The stack 68 of FIGS. 5A and 5B may be considered to comprise alternating insulative levels (intervening levels) 72 and conductive levels 70.

The assembly of FIG. 5A may be considered to be a memory device comprising memory cells 64 and select devices (SGS devices) 66. Although only one of the conductive levels is shown to be incorporated into the SGS devices 66 (the bottommost of the conductive levels), in other embodiments multiple conductive levels may be incorporated into the SGS devices. If multiple conductive levels are incorporated into the SGS devices, the conductive levels may be electrically coupled with one another (ganged together) to be incorporated into long-channel SGS devices. The level(s) comprising SGS devices may be referred to as SGS levels.

The memory cells 64 (e.g., NAND memory cells) are vertically-stacked one atop another. Each of the memory cells comprises a region of the semiconductor material (channel material) 20, and comprises regions (control gate regions) of the conductive levels 70. The regions of the conductive levels 70 which are not comprised by the memory cells 64 may be considered to be wordline regions (routing regions) which couple the control gate regions with driver circuitry and/or with other suitable circuitry. The memory cells 64 comprise the cell materials (e.g., the tunneling material, charge-storage material and charge-blocking material) within the regions 18.

In some embodiments, the conductive levels 70 associated with the memory cells 64 may be referred to as wordline/control gate levels (or memory cell levels), in that they include wordlines and control gates associated with vertically-stacked memory cells of NAND strings. The NAND strings may comprise any suitable number of memory cell levels. For instance, the NAND strings may have 8 memory cell levels, 16 memory cell levels, 32 memory cell levels, 64 memory cell levels, 512 memory cell levels, 1024 memory cell levels, etc.

In some embodiments, the channel-material-pillars 24 may be considered to be representative of a large number of substantially identical channel-material-pillars extending across the memory regions 12a and 12b of FIGS. 5 and 5A.

FIG. 5B shows that the posts 26 extend through the stack 68 to the conductive material 58. The posts 26 include the conductive posts 32, and in the shown embodiment such conductive posts are electrically coupled with the conductive islands 60 comprising the conductive material 58. The conductive posts 32 may be coupled to the CMOS circuitry 62 in embodiments in which the conductive posts 32 are "live" posts. Alternatively, at least some of the conductive posts 32 may not be coupled to the CMOS circuitry in embodiments in which the conductive posts are "dummy" configurations provided for structural support rather than for electrical connections. In embodiments in which the posts 26 are dummy configurations (i.e., provided for structural support only), the posts 26 may comprise only insulative material, rather than comprising the conductive material 28.

In the shown embodiment, each of the islands 60 supports one of the conductive posts 32. In other embodiments, at least one of the islands 60 may support two or more of the conductive posts.

The top-down view of FIG. 5 shows additional conductive posts outward 78 of the panel 38a (i.e., outward of a periphery of the memory region 12a), and shows additional dummy posts 80 between the panel 38a and the conductive posts 78. The conductive posts 78 may be "live" posts, and may be utilized, for example, as interconnects through regions of the stack 68 (FIGS. 5A and 5B) outward of the panel 38a. In some applications, the channel pillars 24 may be coupled with bitlines (described below with reference to FIG. 17C), and may be operatively adjacent SGD devices (also described below with reference to FIG. 17C), and the conductive posts 78 may be utilized for coupling one or both of the SGD devices and the bitlines to logic circuitry under the stack 68 (FIGS. 5A and 5B). The posts 78 are shown to be square-shaped to help distinguish them from the posts 26 of the intermediate region 14. It is to be understood that the posts 78 and 26 may have the same configuration as one another in some embodiments, and may have different configurations relative to one another in other embodiments.

The dummy posts 80 may be utilized to extend through the stack 68 of conductive levels 70 (FIGS. 5A and 5B) to reduce stress(es) caused by the high density of conductive material within the levels 70. In some embodiments, the panels 38 may comprise material which blocks formation of conductive material within the levels 70 in regions peripherally outward of the panels 38 (described below with reference to FIG. 8). In such embodiments, it may be suitable to eliminate the dummy posts 80. The dummy posts 80 may be square-shaped in the top-down view of FIG. 5 (as shown), or may comprise any other suitable shapes.

The dummy posts 80 are shown with smaller squares than the posts 78 in the top-down view of FIG. 5 so that they may be distinguished from the posts 78. It is to be understood, however, that the dummy posts 80 may have any suitable size relative to the posts 78, and may be the same size as the posts 78, smaller than the posts 78, or larger than the posts 78.

The posts 80 and 78 are shown along only one of the peripheral edges of the memory-block-regions 34 to simplify the drawing. In other embodiments, additional posts 80 and 78 may be along other peripheral edges (e.g., outward of the panel 38b) of the memory-block-regions 34.

FIG. 5 shows staircase connections 82 in the staircase regions 40a and 40b. The staircase connections 82 may be utilized for coupling wordlines along the conductive levels 70 (FIG. 5A) with driver circuitry and/or any other suitable circuitry. The staircase connections 82 may comprise conductive core regions laterally surrounded by annular rings of insulative material. The rings of insulative material are not shown in FIG. 5 to simplify the drawing. The staircase connections may be circular in the top-down view of FIG. 5 (as shown), or may comprise any other suitable shapes. The staircase connections are shown with smaller circles than the posts 26 in the top-down view of FIG. 5 so that they may be distinguished from the posts 26. It is to be understood, however, that the staircase connections 82 may have any suitable size relative to the posts 26, and may be the same size as the posts 26, smaller than the posts 26, or larger than the posts 26.

Figure 6:
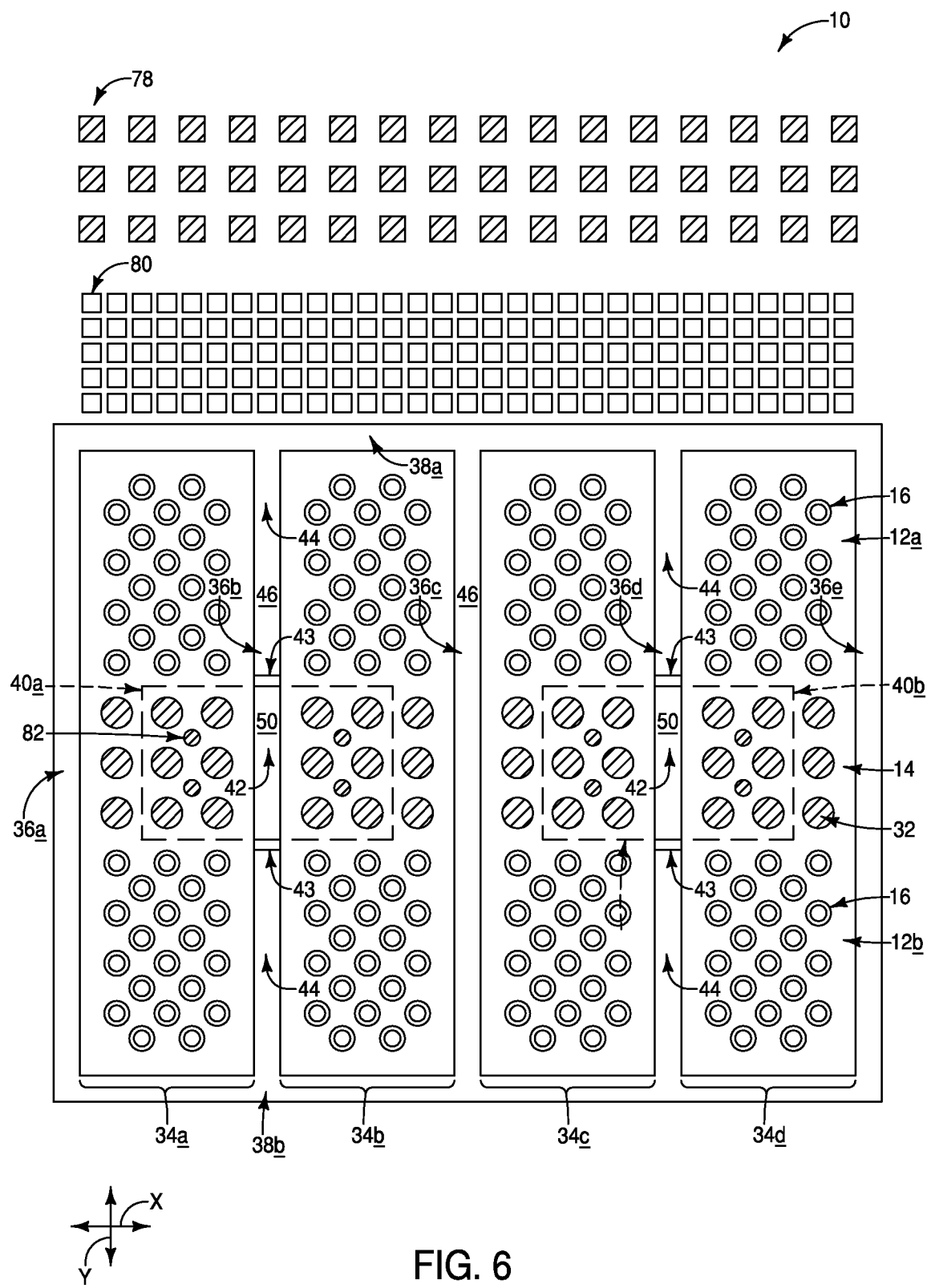
FIGS. 6-10 are diagrammatic top-down views of regions of example integrated assemblies showing example embodiments.

FIG. 5 shows an embodiment in which the first panel regions 42 are laterally thicker than the second panel regions 44. In other embodiments, the first panel regions 42 may be about the same lateral thickness as the second panel regions 44, at least along the interfaces 43 where the first and second panel regions abut one another, as shown in FIG. 6. Although the first panel regions 42 is shown to have the same lateral thickness along the entire longitudinal expanse of such first panel regions in the embodiments of FIGS. 5 and 6, it is to be understood that in some embodiments the lateral thickness of the first panel regions may vary along the longitudinal expanse of the panel regions. Regardless, it is desirable for the first panel regions 42 to have a lateral thickness (width) at least as large as the lateral thickness (width) of the second panel regions 44 along the interfaces 43.

The first panel regions 42 of FIG. 6 may comprise a different composition relative to the second panel regions 44. For instance, the panel regions 42 may comprise the composition 50 described above with reference to FIG. 5B, and the panel regions 44 may comprise the materials 46 and 48 described above with reference to FIG. 5A.

Figure 7:
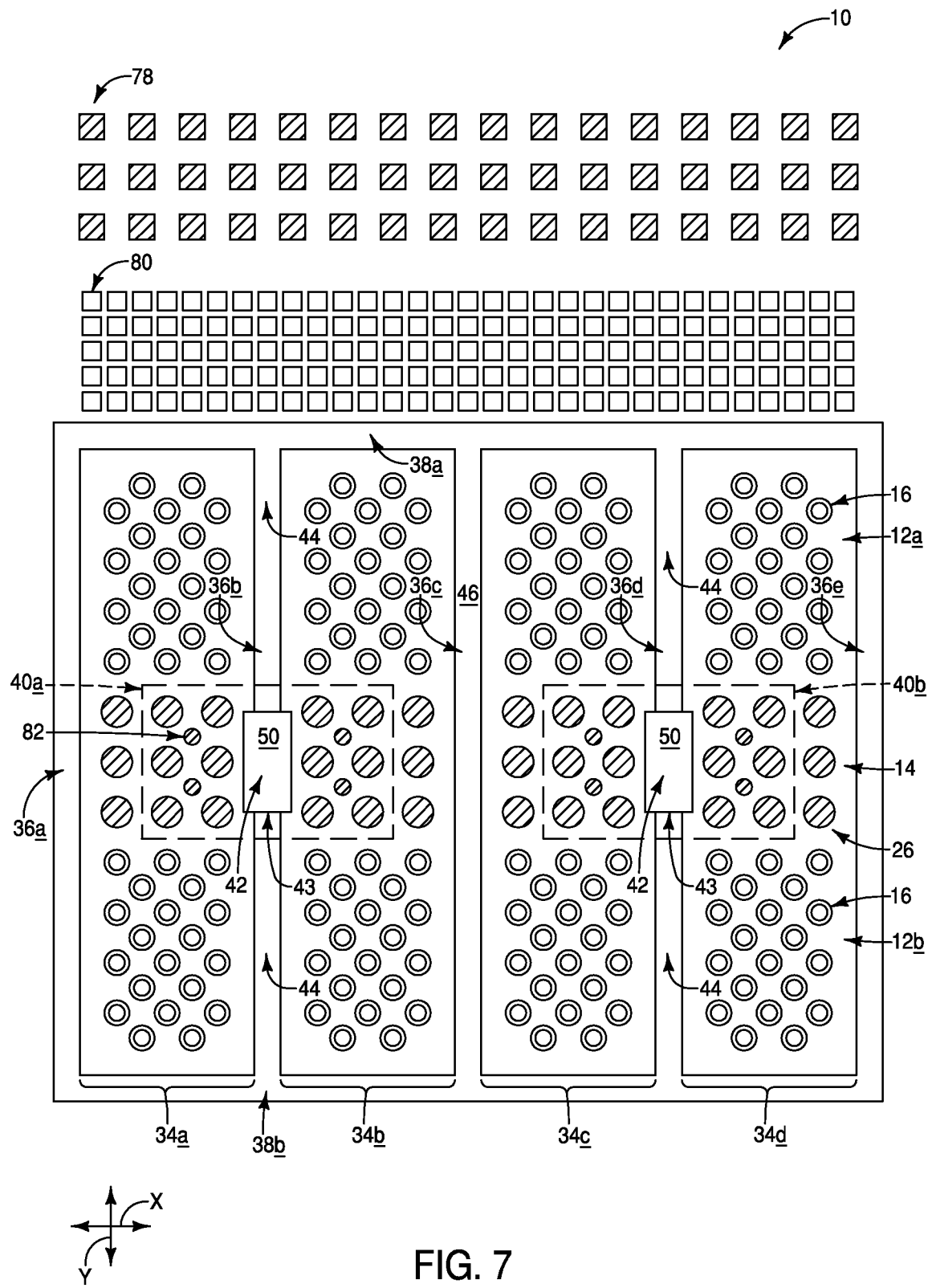

In some embodiments, the first regions 44 may extend longitudinally across only a portion of the staircase regions 40a and 40b, as shown in FIG. 7, rather than extending entirely across the staircase regions.

Figure 8:
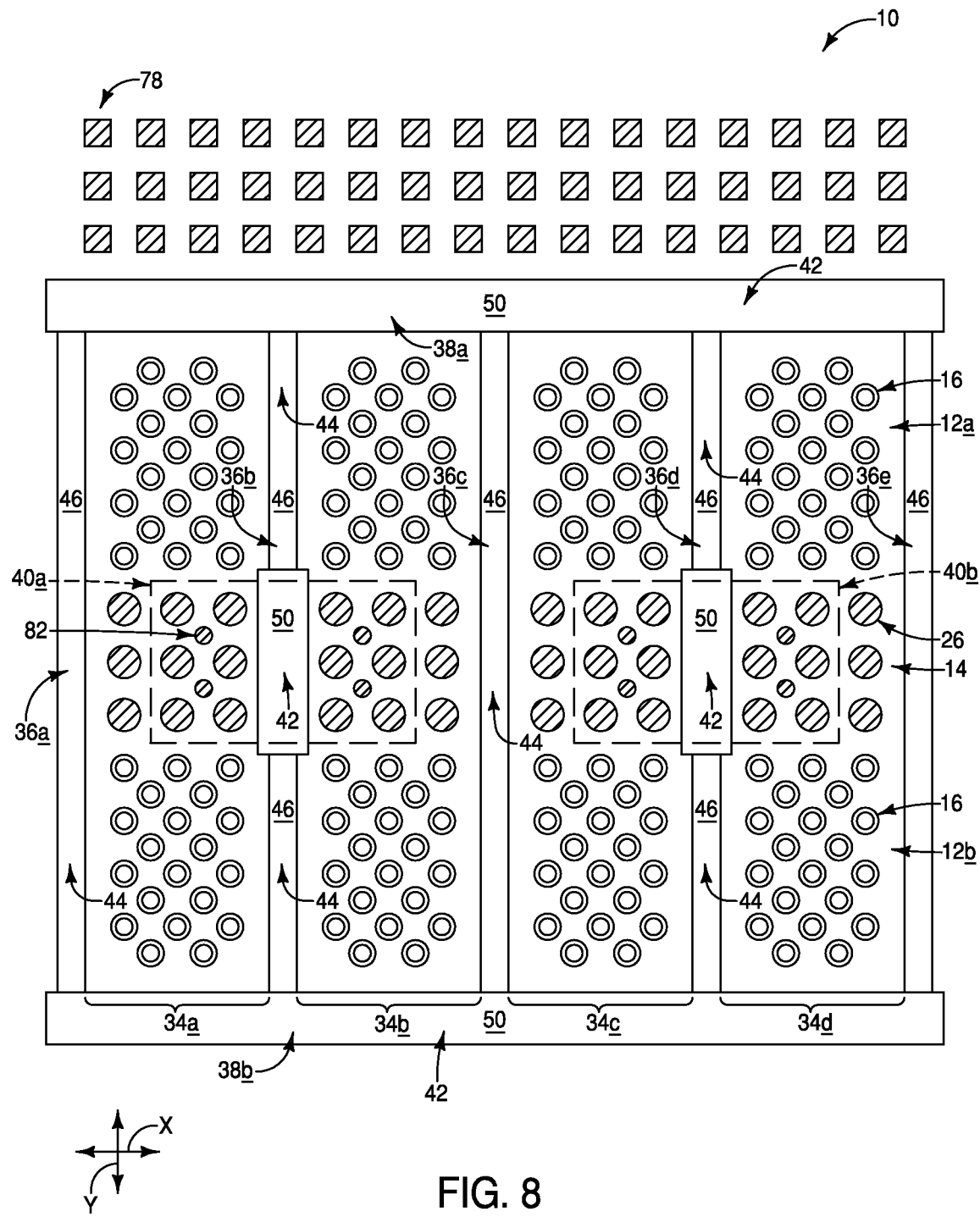

In some embodiments, the laterally-extending-panels 38a and 38b may include the first panel regions 42, as shown in FIG. 8. The illustrated embodiment shows the laterally-extending-panels 38a and 38b including only the first panel regions 42, and in the shown embodiment comprising the composition 50.

If the laterally-extending-panels 38a and 38b comprise the first regions 42 (e.g., the composition 50) such may be formed as support structures prior to formation of the conductive material 74 within the levels 70 of the stack 68 (with the levels 70 and the stack 68 being shown in FIGS. 5A and 5B). The panel regions 42 may protect portions of the stack outward of the panel regions from being exposed to conditions which replace insulative material within the levels 70 with conductive material (with such replacement being described below with reference to FIG. 16B), and accordingly the conductive material does not form in regions of the stack outward of the laterally-extending-panels 38a and 38b. In some embodiments, such may enable the dummy pillars 80 (FIG. 5) to be eliminated, as such dummy pillars are generally utilized to reduce stresses caused by the metal-containing levels 70 in regions outward of the laterally-extending-panels 38a and 38b. Thus, the embodiment of FIG. 8 shows the live pillars 78 being outward of the laterally-extending-panel 38a, and being adjacent to the panel 38a such that there are no intervening dummy pillars (the pillars 80 of FIG. 5) between the live pillars 78 and the laterally-extending-panel 38a.

Figure 9:
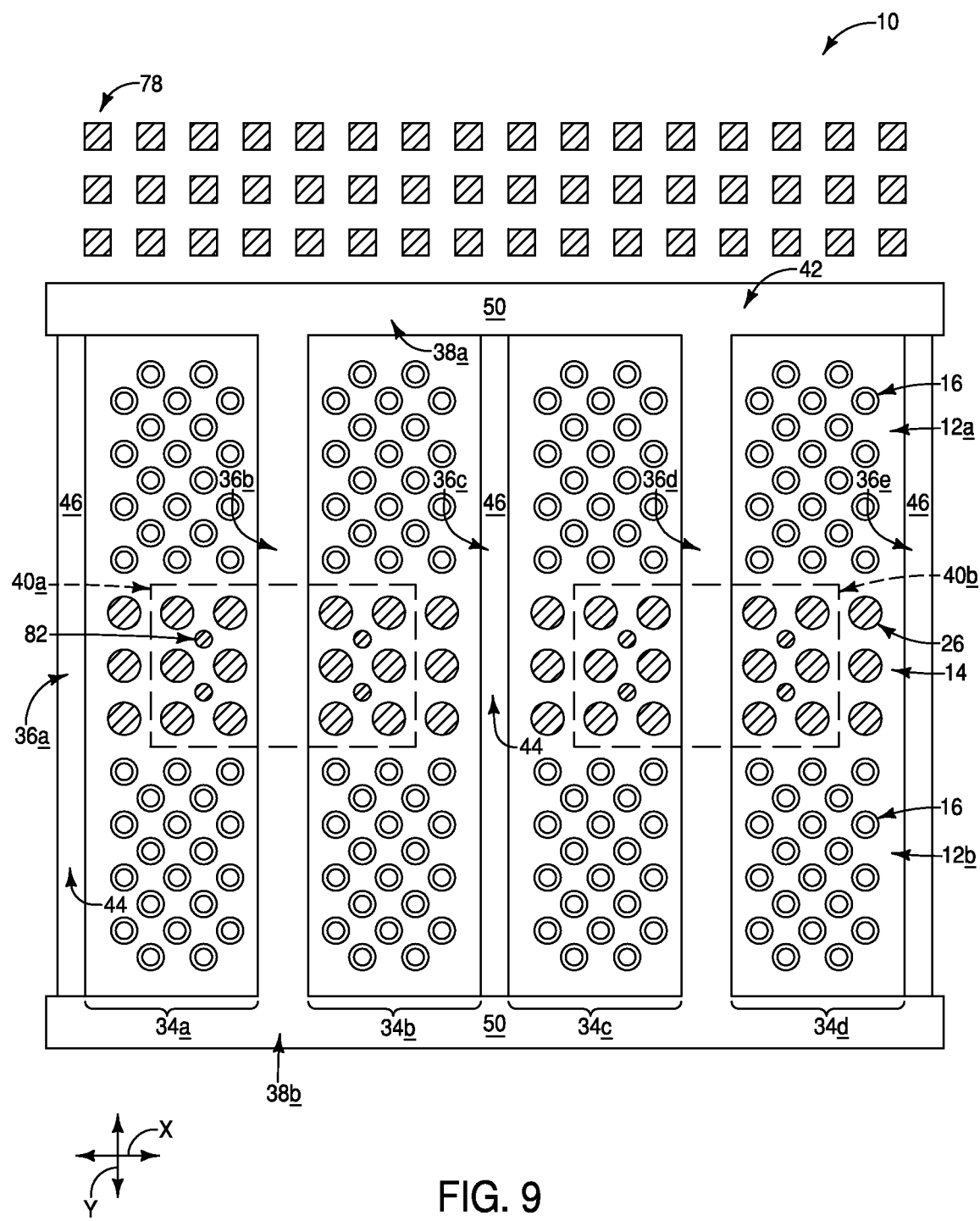
Figure 10:
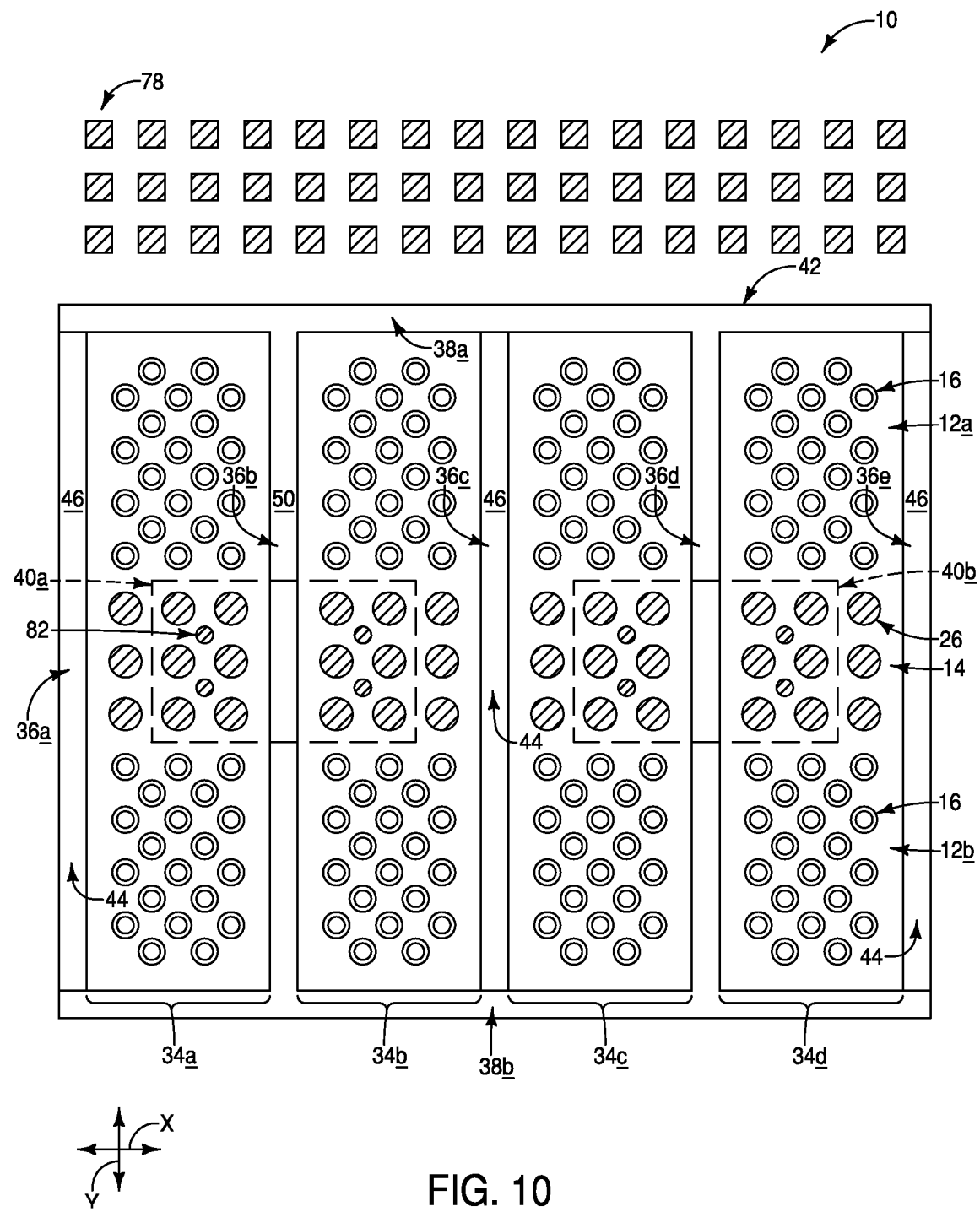

The embodiments of FIGS. 5-8 show the longitudinally-extending-panels 36b and 36d to comprise both the first panel regions 42 and the second panel regions 44. In other embodiments, the longitudinally-extending-panels 36b and 36d may comprise only the first panel regions 42, as shown in FIGS. 9 and 10. FIG. 9 shows the second panel regions 44 to be thinner (less wide) than the first panel regions 42, and FIG. 10 shows the first and second panel regions 42 and 44 to be about the same thickness (width) as one another.

The integrated assemblies of FIGS. 5-10 may be formed with any suitable methods. An example method is described with reference to FIGS. 11-17. The particular method of FIGS. 11-17 is specific for fabrication of the integrated assembly of FIG. 10, but it is to be understood that analogous methods may be utilized for fabrication of integrated assemblies of other embodiments.

Figure 11A:
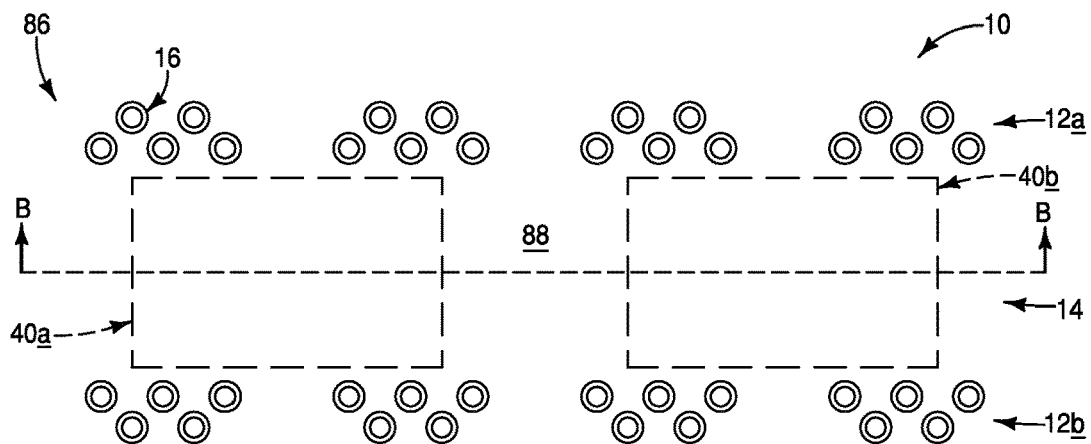
FIGS. 11A and 11B are a diagrammatic top-down view and a diagrammatic cross-sectional side view of a region of an example integrated assembly at an example process stage of an example method. The cross-sectional side view of FIG. 11B is along the line B-B of FIG. 11A.
Figure 11B:
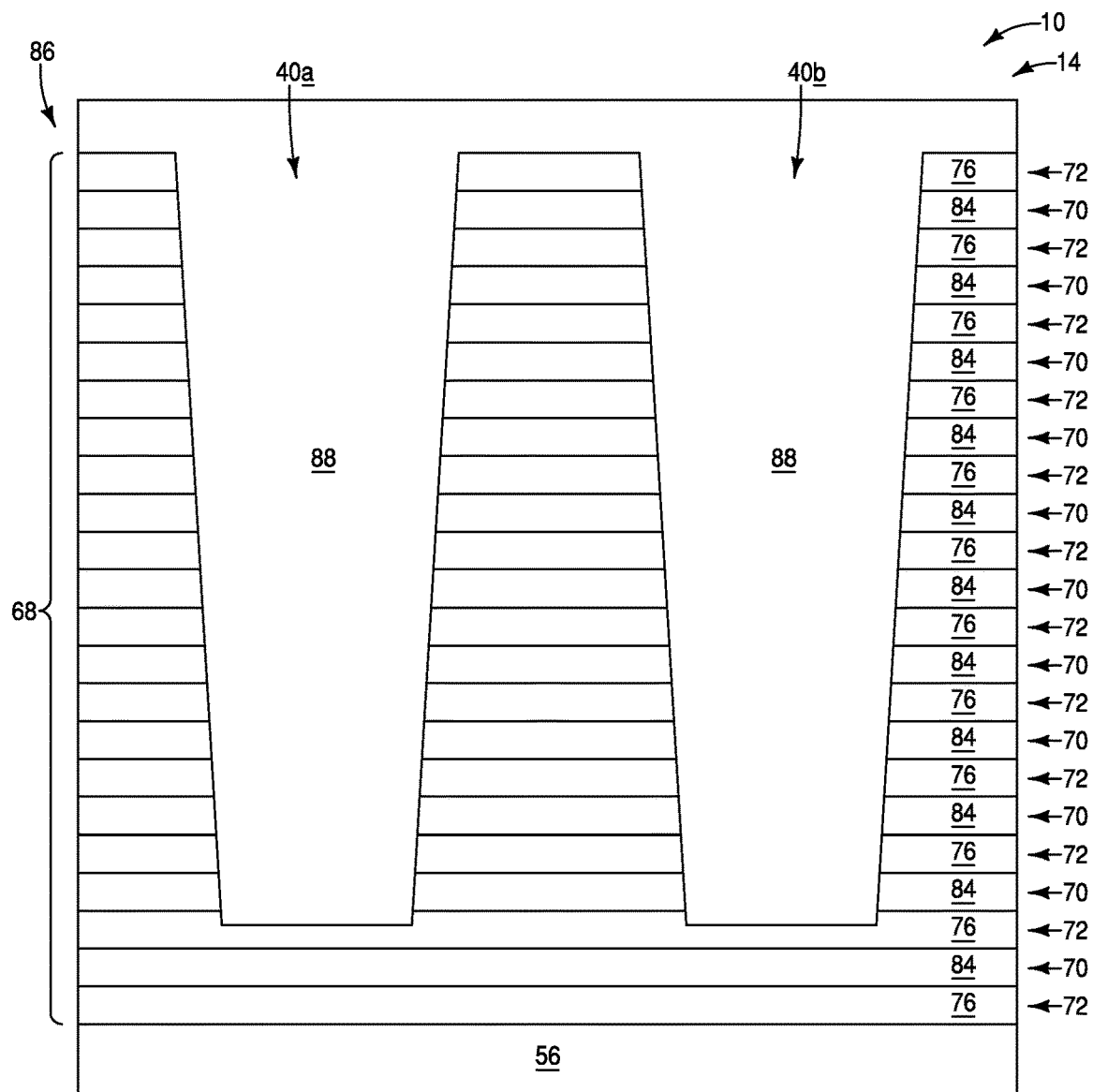

Referring to FIGS. 11A and 11B, a region of an integrated assembly 10 is shown in top-down view and cross-sectional side view, respectively. The side view of FIG. 11B is along the line B-B of FIG. 11A. Also, an additional cross-sectional side view is provided in FIG. 11C, with such view being within a memory region 12a. The view of FIG. 11C is provided to a different scale than the views of FIGS. 11A and 11B, but is shown at the same process stage as FIGS. 11A and 11B.

Figure 11C:
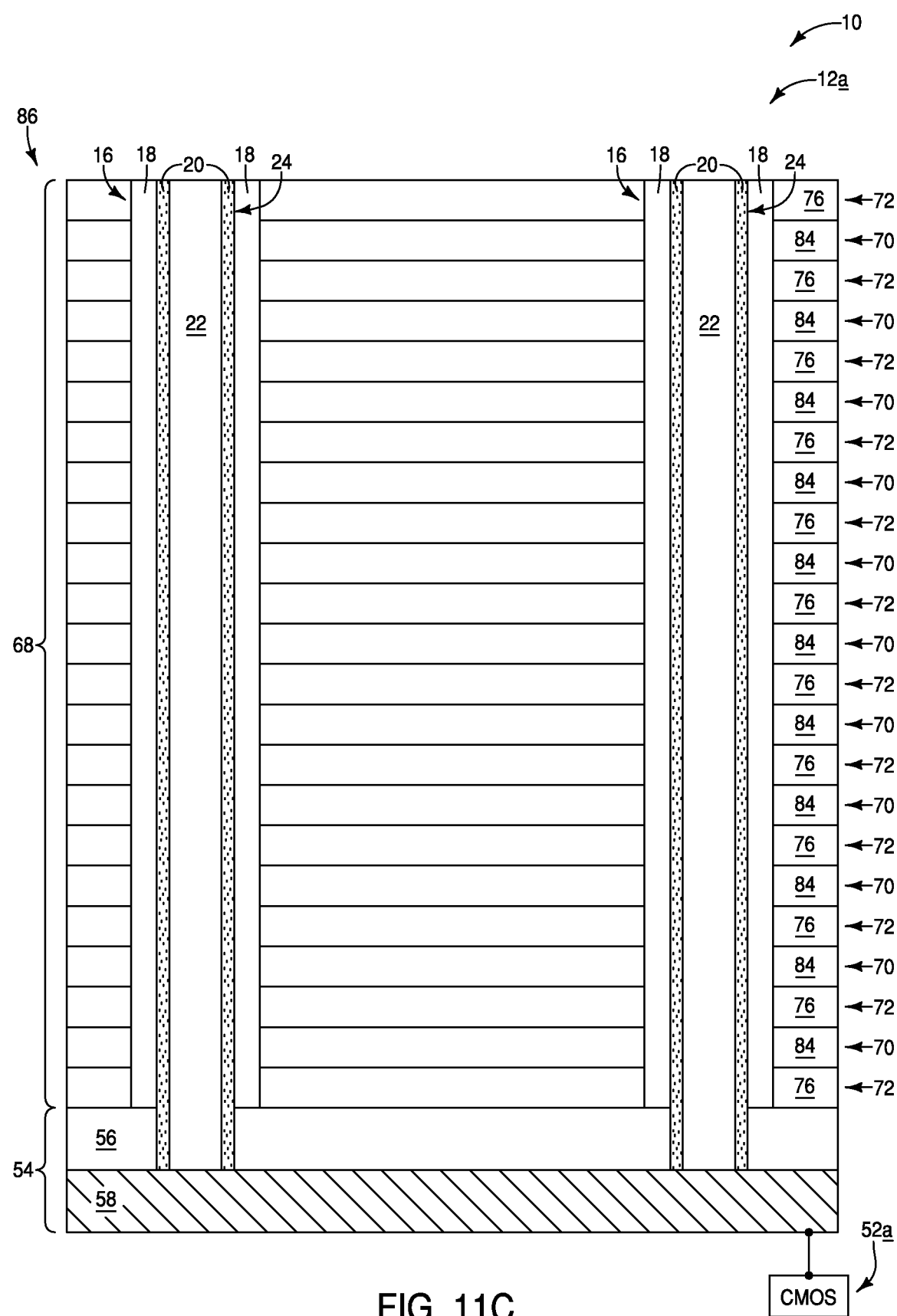
FIG. 11C is a diagrammatic cross-sectional side view of a region of the assembly of FIG. 11A at the same process stage as FIG. 11A.

FIG. 11C shows the source structure 54 comprising the materials 58 and 56. FIG. 11B shows the material 56, but does not show the material 58 in order to simplify the drawings.

The cell-material-pillars 16 are formed at the process stage of FIG. 11A-C, and are diagrammatically illustrated in FIGS. 11A and 11C.

The stack 68 comprises the alternating first and second levels 70 and 72. At the process stage of FIGS. 11A-C, the levels 72 comprise the insulative material 76, and the levels 70 comprise a sacrificial material 84. In some embodiments, the material 84 may comprise, consist essentially of, or consist of silicon nitride; and the material 76 may comprise, consist essentially of, or consist of silicon dioxide.

The stack 68 may be considered together to be part of a construction 86. In the shown embodiment, such construction includes the first memory region 12a, the second memory region 12b and the intermediate region 14 laterally between the first and second memory regions.

The staircase regions (staircase locations) 40a and 40b are defined within the intermediate region 14, and correspond to openings etched into the stack 68 (as shown in FIG. 11B). In some embodiments, the staircase locations 40a and 40b may be referred to as stadium locations to better describe a three-dimensional configuration of the locations. FIG. 11B shows the staircase regions penetrating partially into the stack 68. Specifically, the staircase locations do not penetrate to the bottom level 70 which will be incorporated into an SGS level (with the SGS level being described above with reference to FIG. 5A).

Insulative material 88 is formed within the staircase regions 40a and 40b. The insulative material 88 may comprise any suitable composition(s), and in some embodiments may comprise, consist essentially of, or consist of silicon dioxide, aluminum oxide, carbon-doped silicon oxide, boron-doped silicon oxide, undoped silicon, etc. In some embodiments, the material 88 may include one or more liners formed along the materials of the stack 68. Such liners may comprise any suitable materials, including, for example, one or more of undoped silicon, silicon nitride, aluminum oxide, hafnium oxide, etc.

Figure 12A:
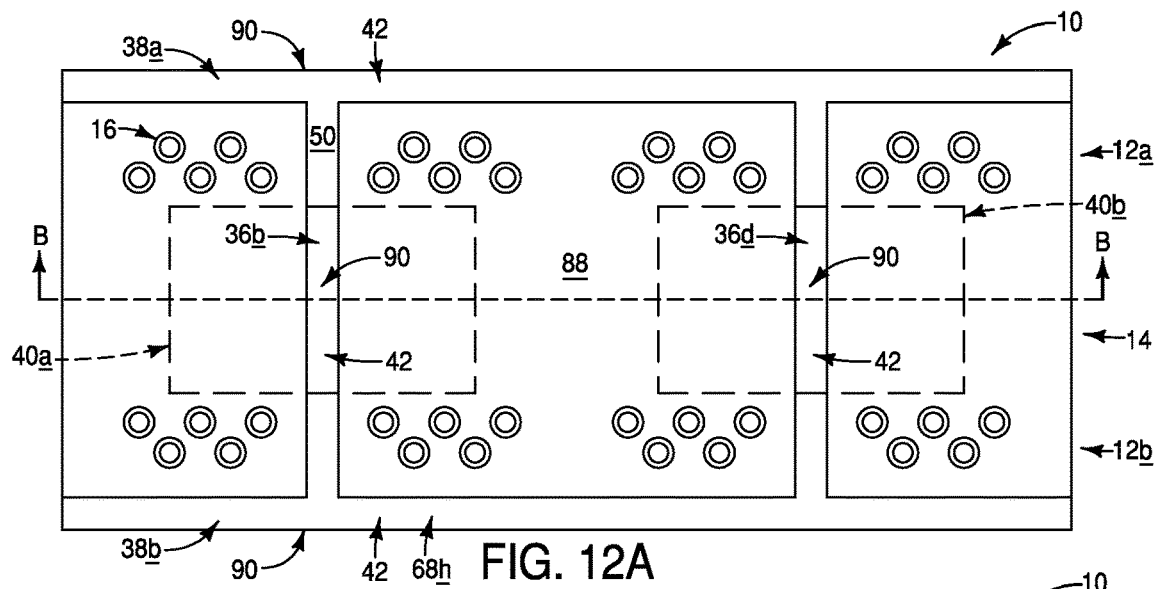
FIGS. 12A and 12B are a diagrammatic top-down view and a diagrammatic cross-sectional side view of the region of the example integrated assembly of FIGS. 11 and 11B at an example process stage following that of FIGS. 11A and 11B. The cross-sectional side view of FIG. 12B is along the line B-B of FIG. 12A.
Figure 12B:
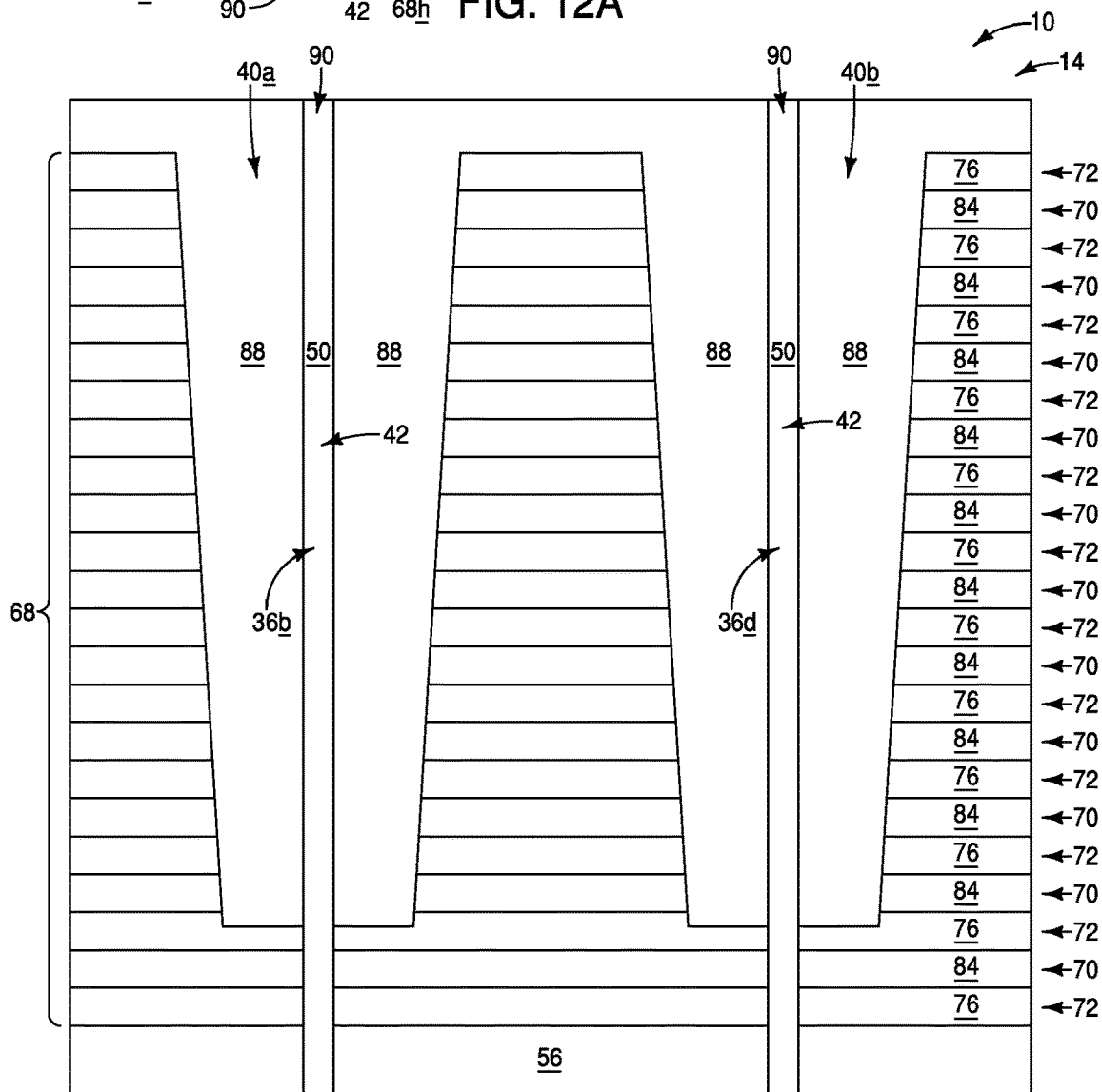

Referring to FIGS. 12A and 12B, first slit-openings 90 are formed to extend through the stack 68, with a pair of the slit-openings 90 being within the panel locations 36b and 36d, and accordingly having segments which extend across the staircase locations 40a and 40b. The first panel material 50 is formed within the slit openings 90 to form the first panel regions 42. In some embodiments, the panel material 50 may comprise, consist essentially of, or consist of silicon dioxide.

Figure 13A:
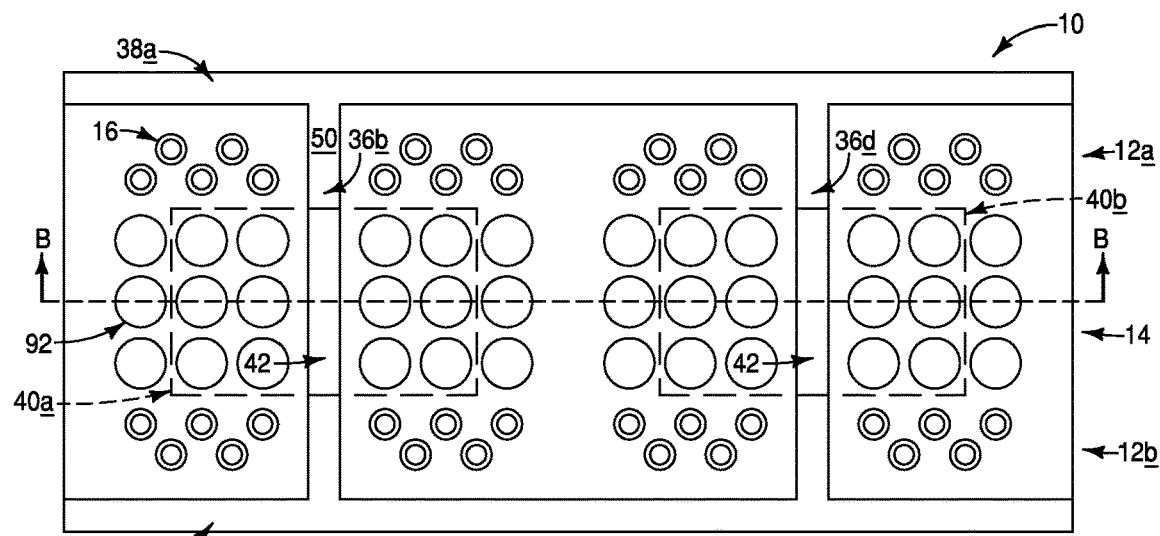
FIGS. 13A and 13B are a diagrammatic top-down view and a diagrammatic cross-sectional side view of the region of the example integrated assembly of FIGS. 11 and 11B at an example process stage following that of FIGS. 12A and 12B. The cross-sectional side view of FIG. 13B is along the line B-B of FIG. 13A.
Figure 13B:
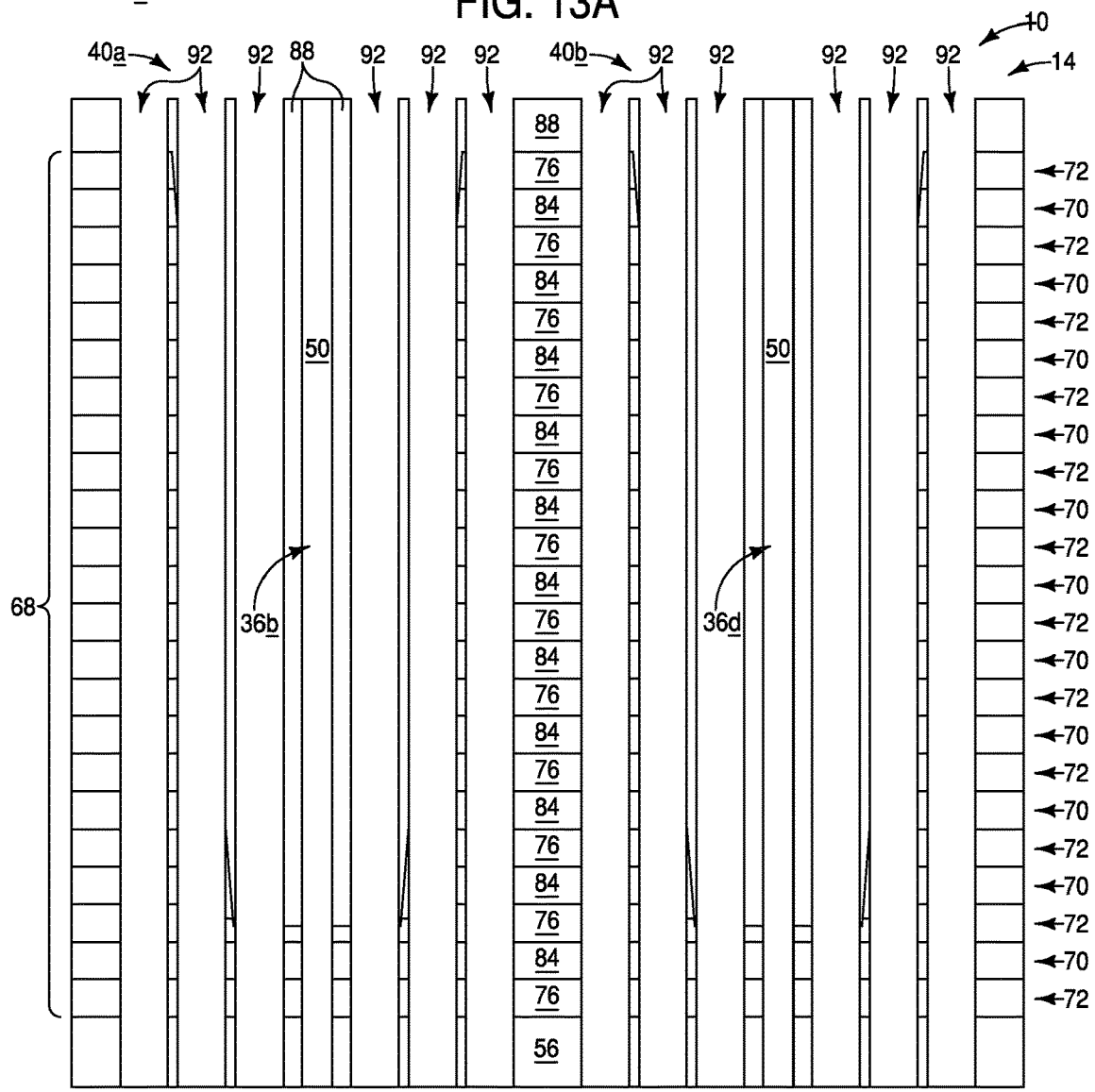

Referring to FIGS. 13A and 13B, post-openings 92 are formed to extend through the stack 68 within the intermediate region 14.

Figure 14A:
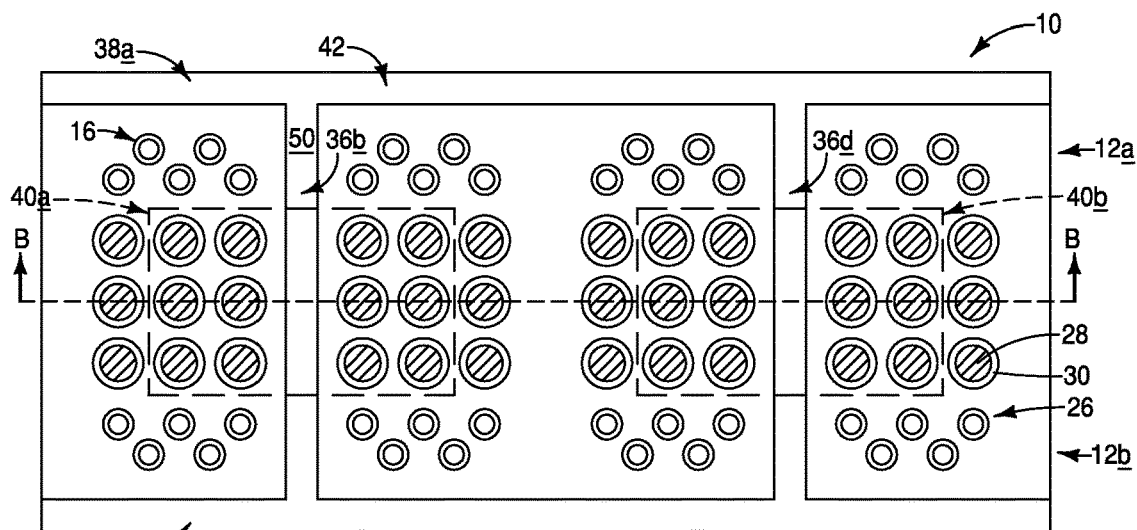
FIGS. 14A and 14B are a diagrammatic top-down view and a diagrammatic cross-sectional side view of the region of the example integrated assembly of FIGS. 11 and 11B at an example process stage following that of FIGS. 13A and 13B. The cross-sectional side view of FIG. 14B is along the line B-B of FIG. 14A.
Figure 14B:
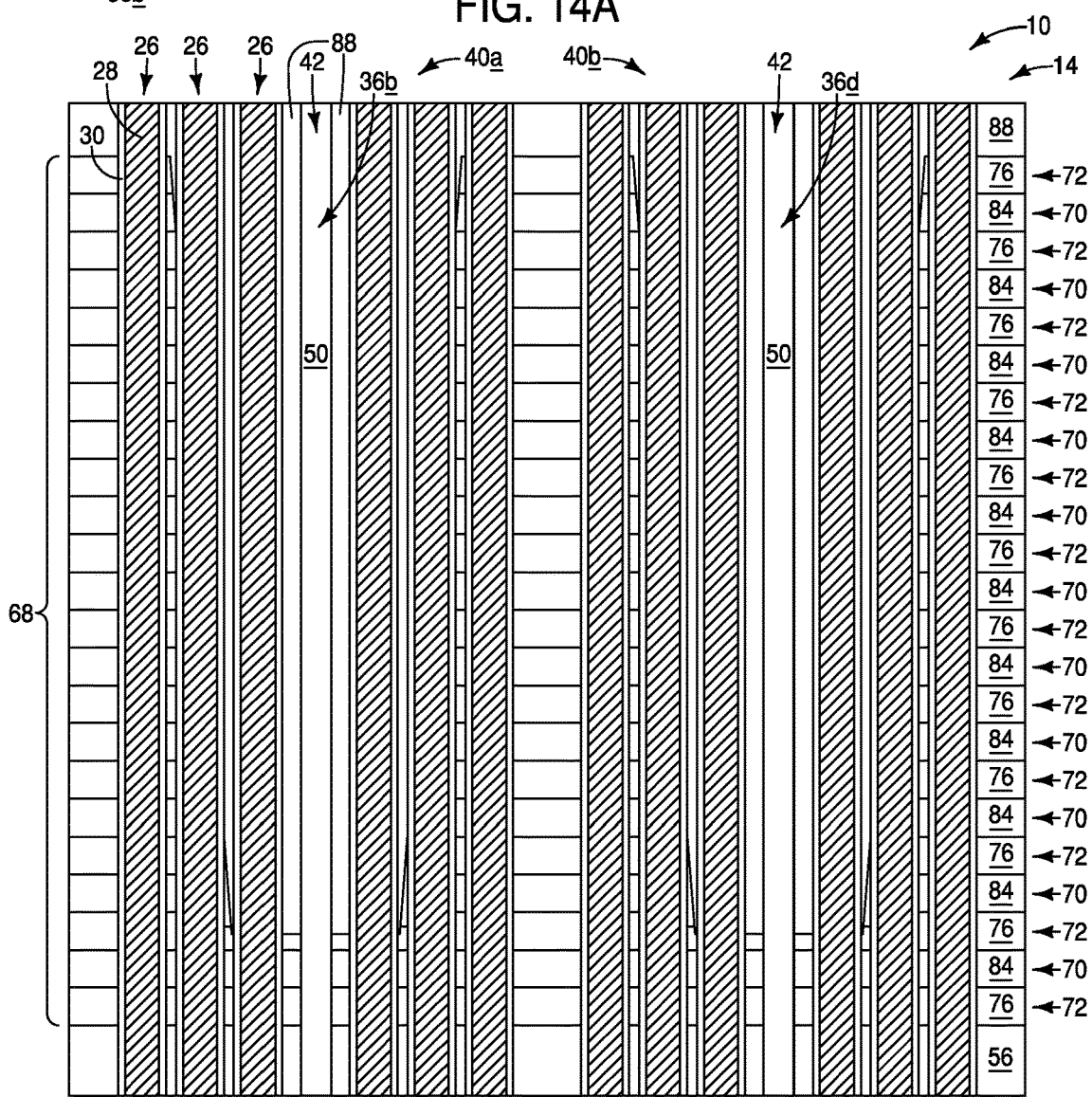

Referring to FIGS. 14A and 14B, post material is formed within the post-openings 92. In the illustrated embodiment, the post material includes the conductive material 28 and the insulative liner material 30. The post material within the post-openings 92 forms the posts 26.

Although the post-openings 92 (FIGS. 13A and 13B) are shown formed after the slit-openings 90 (FIGS. 12A and 12B), it is to be understood that in other embodiments the post-openings 92 may be formed simultaneously with the slit-openings 90 or prior to the slit-openings 90.

Figure 15A:
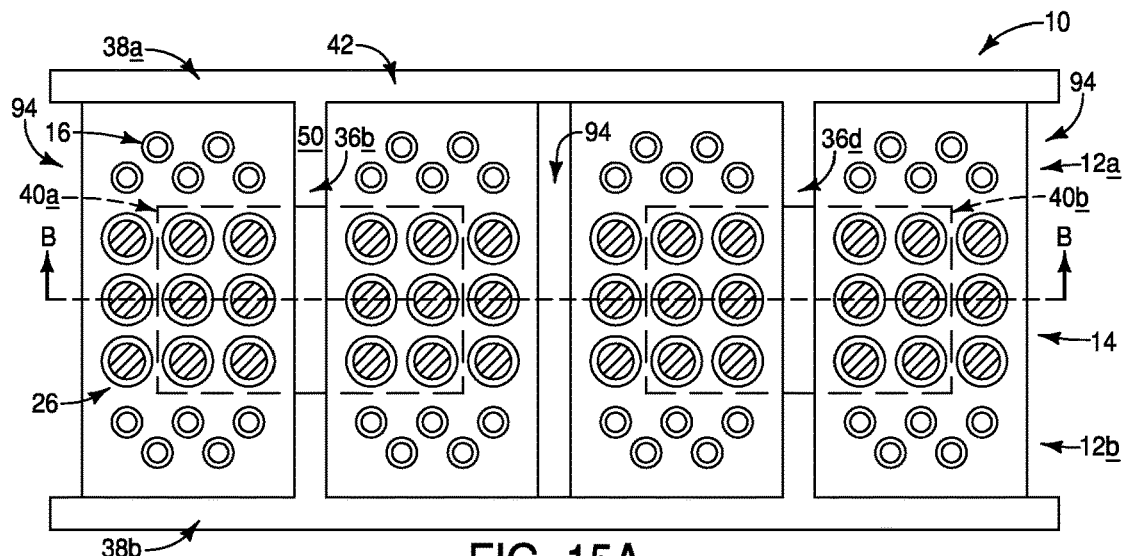
FIGS. 15A and 15B are a diagrammatic top-down view and a diagrammatic cross-sectional side view of the region of the example integrated assembly of FIGS. 11 and 11B at an example process stage following that of FIGS. 14A and 14B. The cross-sectional side view of FIG. 15B is along the line B-B of FIG. 15A.
Figure 15B:
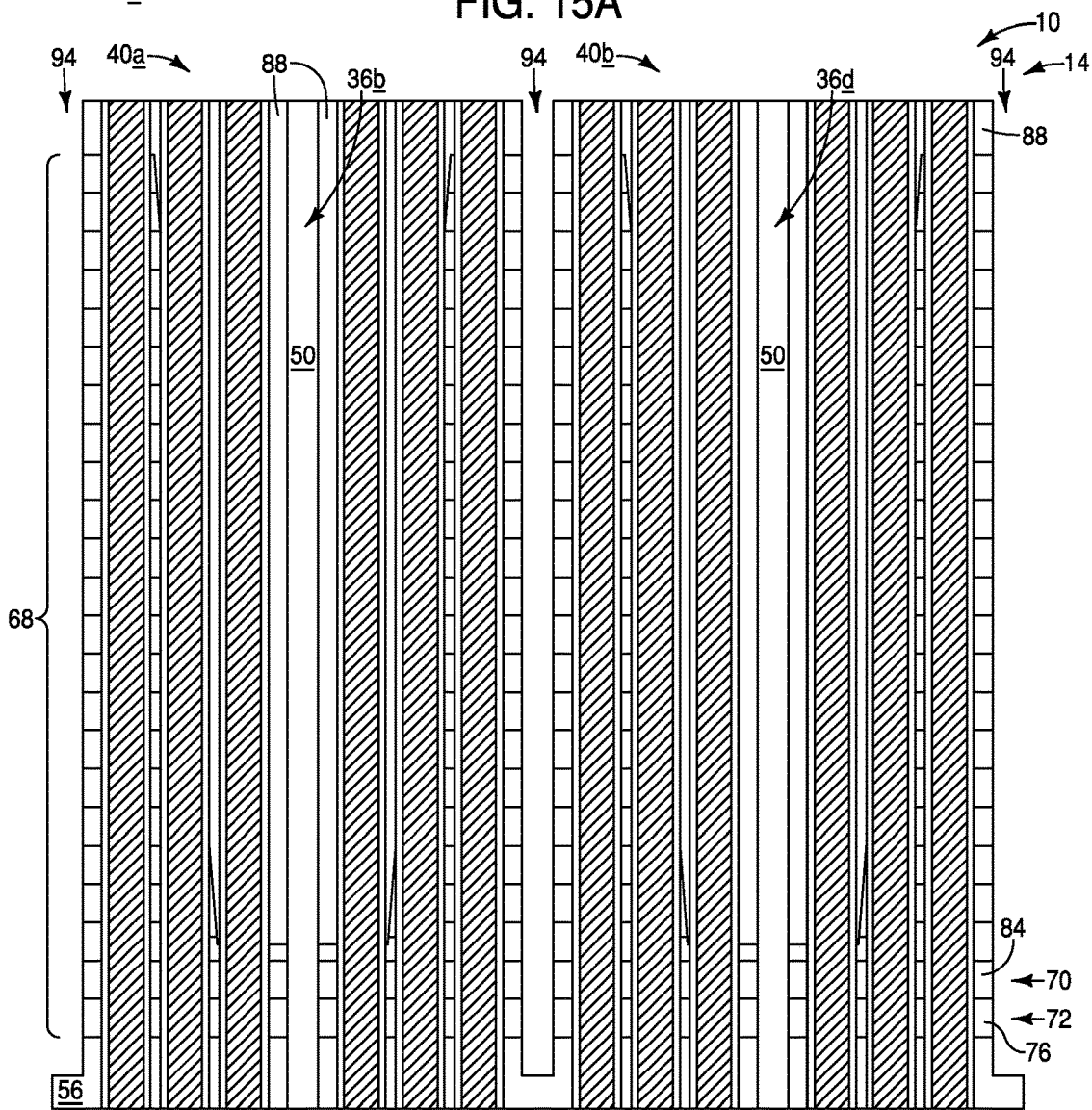

Referring to FIGS. 15A and 15B, second slit-openings 94 are formed to pass through the stack 68. The illustrated second slit-openings 94 extend longitudinally across the memory regions 12a and 12b, and across the intermediate region 14. The illustrated embodiment ultimately forms a configuration analogous that of FIG. 10, and thus the slit-openings 94 are all formed to extend longitudinally. In other embodiments, assemblies analogous to those of FIGS. 5-7 may be formed, and thus at least some of the second slit-openings 94 may extend laterally.

Figure 16A:
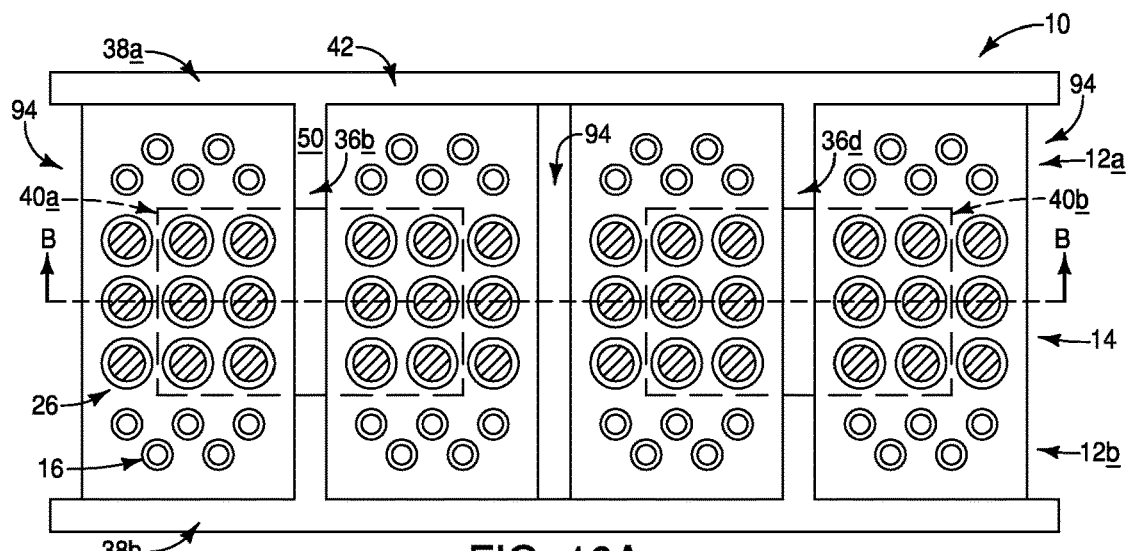
FIGS. 16A and 16B are a diagrammatic top-down view and a diagrammatic cross-sectional side view of the region of the example integrated assembly of FIGS. 11 and 11B at an example process stage following that of FIGS. 15A and 15B. The cross-sectional side view of FIG. 16B is along the line B-B of FIG. 16A.
Figure 16B:
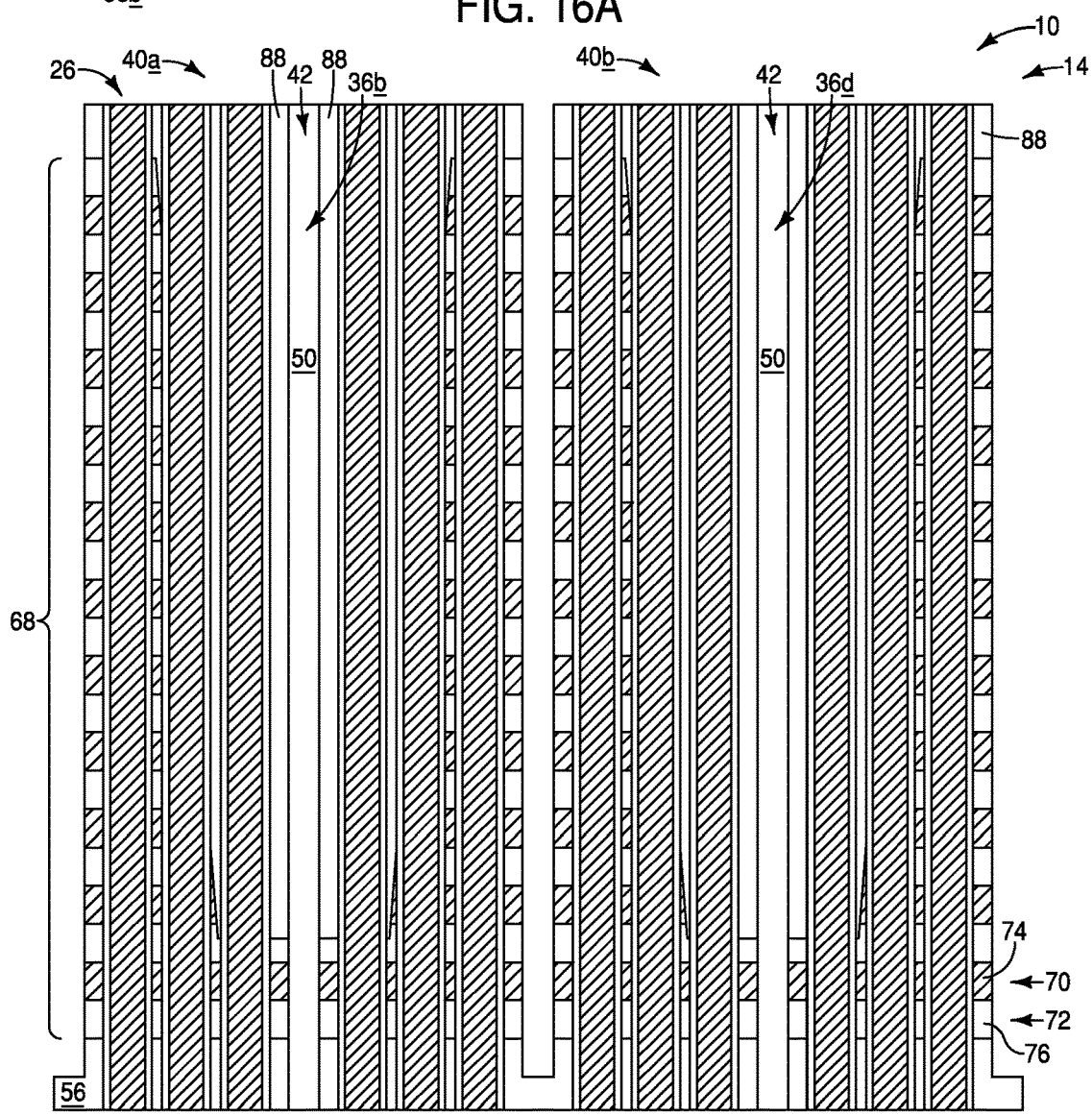

Referring to FIGS. 16A and 16B, the sacrificial material 84 (FIG. 15B) of the first levels 70 is removed and replaced with the conductive material 74. Although the conductive material 74 is shown to entirely fill the first levels 70, in other embodiments at least some of the material provided within the first levels 70 may be insulative material (e.g., dielectric-blocking material). The conductive material 74 may comprise any suitable composition(s); and in some embodiments may comprise a tungsten core at least partially surrounded by titanium nitride. The dielectric-barrier material may comprise any suitable composition(s); and in some embodiments may comprise one or more of aluminum oxide, hafnium oxide, zirconium oxide, etc.

The first levels 70 of FIGS. 16A and 16B are conductive levels, and the stack 68 may be considered to comprise alternating insulative levels (intervening levels) 72 and conductive levels 70.

Figure 17A:
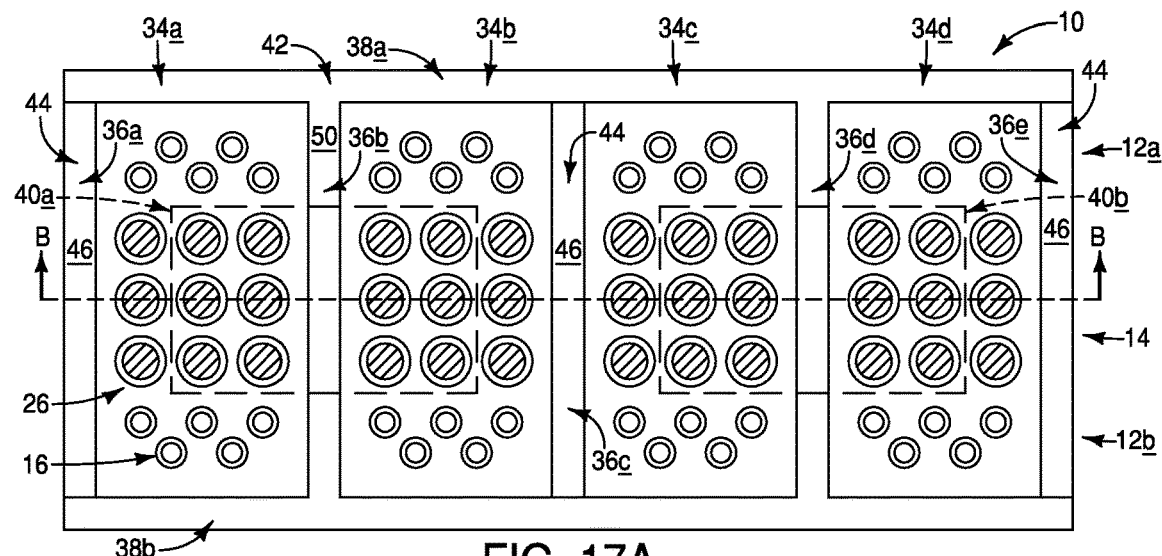
FIGS. 17A and 17B are a diagrammatic top-down view and a diagrammatic cross-sectional side view of the region of the example integrated assembly of FIGS. 11 and 11B at an example process stage following that of FIGS. 16A and 16B. The cross-sectional side view of FIG. 17B is along the line B-B of FIG. 17A.
Figure 17B:
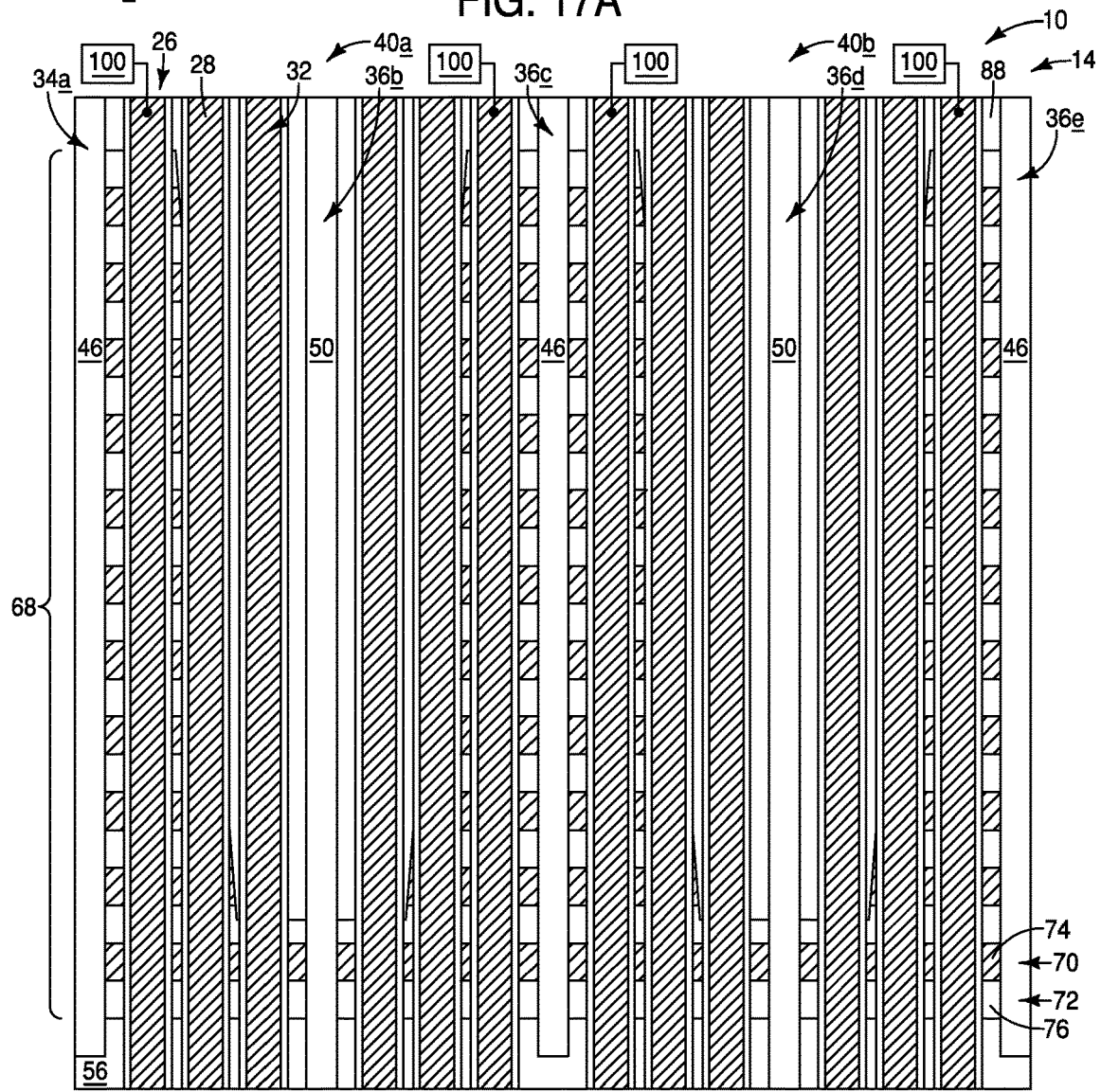

Referring to FIGS. 17A and 17B, second panel material 46 is formed within the slit-openings 94 (FIGS. 16A and 16B). The panel material 46 may comprise the compositions described above with reference to FIGS. 5 and 5A. The liner material 48 (FIG. 5A) may be provided adjacent the panel material 46, but is not shown in FIGS. 17A and 17B to simplify the drawings.

The panel material 46 forms the longitudinally-extending panels 36a, 36c and 36e. The memory-block-regions 34a-d are bounded by the longitudinally-extending panels 36a-e, and the laterally-extending panels 38a and 38b. In some embodiments, the panel material 46 may be considered to form the second panel regions 44.

Although the panel materials 50 and 46 are shown to be different relative to one another, it is to be understood that in other embodiments the panel materials 50 and 46 may be the same composition as one another.

In the illustrated embodiment of FIGS. 11-16, the first slit-openings 90 (FIGS. 12A and 12B) are formed along outer boundaries on opposing sides of the regions 12a, 14 and 12b to define the laterally-extending-slits ultimately utilized to form the laterally-extending-panels 38a and 38b. In other embodiments, it may be the second slit-openings 94 (FIGS. 15A and 15B) which are formed along such outer boundaries and ultimately utilized to form the laterally-extending-panels 38a and 38b. If the first slit-openings 90 are utilized to form the laterally-extending-panels 38a and 38b, then constructions of the types shown in FIGS. 8-10 will be formed, with the material 50 of the first panel regions 42 being within the laterally-extending-panels 38a and 38b. Alternatively, if the second slit-openings 94 are utilized to form the laterally-extending-panels 38a and 38b, then constructions of the types shown in FIGS. 5-7 will be formed, with the material 46 of the second panel regions 44 being within the laterally-extending-panels 38a and 38b.

Although the slit-openings 90 (FIG. 12) and 94 (FIG. 15) are shown to have about the same lateral widths as one another, it is to be understood that in other embodiments such slit-openings may have different lateral widths relative to one another to form configurations analogous to those of FIGS. 5, 7, 8 and 9.

Figure 17C:
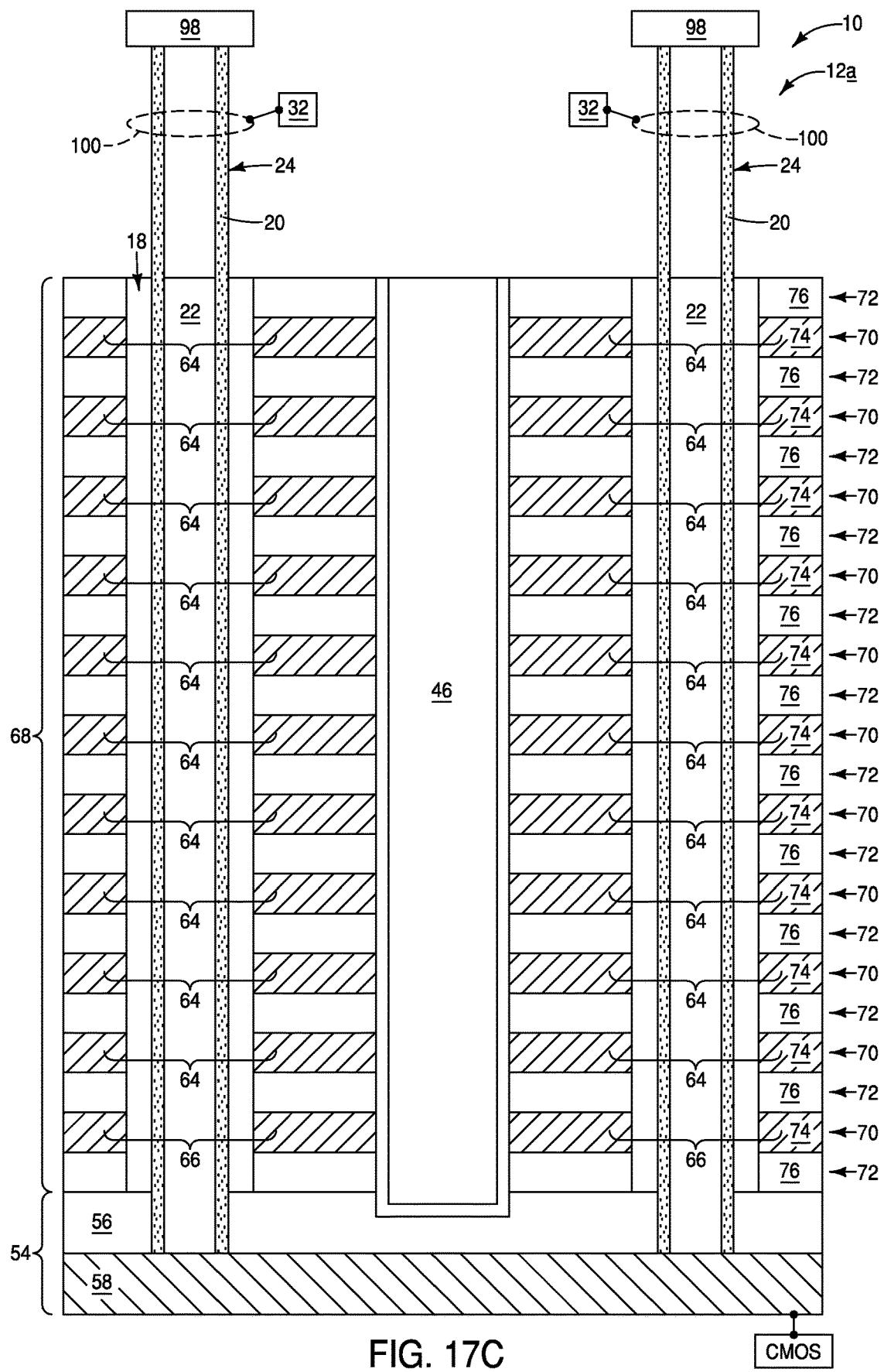
FIG. 17C is a diagrammatic cross-sectional side view of a region of the assembly of FIG. 17A at the same process stage as FIG. 17A, and is a view along the same cross-section as that shown in FIG. 11C.

FIG. 17C shows an additional cross-sectional side view of the assembly 10 at the process stage of FIGS. 17A and 17B, with the view of FIG. 17C being within a memory region 12a and along the same cross-section as FIG. 11C. The channel-material-pillars 24 are coupled with bitlines 98. SGD devices 100 are diagrammatically illustrated as being adjacent to the upper regions of the pillars 24, and to be beneath the bitlines 98.

The bitlines 98 may extend in and out of the page relative to the cross-sectional view of FIG. 17C.

The pillars 26, bitlines 98, SGD devices 100, SGS devices 66 and memory cells 64 may be together considered to form NAND-type configurations analogous to those described above with reference to FIGS. 1-4.

The SGD devices 100 are indicated to be coupled to the conductive posts 32 in the view of FIG. 17C, and some of the conductive posts 32 are indicated to be coupled with the SGD devices 100 in the view of FIG. 17B. Accordingly, in some embodiments the SGD devices 100 associated with a memory region (12a or 12b) may be coupled to the logic circuitry (e.g., 52b and 52c of FIG. 5B) through the conductive posts 32 associated with the intermediate region 14.

The SGD devices 100 are examples of components that may be associated with the cell-material-pillars 16 and coupled with logic circuitry through the conductive posts 32. In other embodiments, other components may be coupled to logic circuitry through one or more of the conductive posts 32, either in addition to, or alternatively to, the SGD devices 100. For instance, the bitlines 98 may be coupled to the logic circuitry through the conductive posts 32, and in such embodiments the logic circuitry may include sensing circuitry (e.g., sense-amplifier-circuitry) coupled to the bitlines through the conductive posts 32. Generally, one or more components may be operatively proximate to the cell-material-pillars 16 (and/or the channel-material-pillars 24), and may be coupled to the logic circuitry 52 (FIG. 5B) through the conductive posts 32.

FIG. 17B shows only some of the conductive posts 32 coupled with the SGD devices 100. Such conductive posts may be considered to be "live" posts as they are utilized for forming electrical connections. The remaining conductive posts 32 may be "dummy" posts utilized solely for providing structural support. The dummy posts may or may not include the conductive material 28. For instance, in some embodiments the dummy posts may be filled separately relative to the live posts so that the live posts comprise the conductive material 28 of the conductive posts 32, and so that the dummy posts comprise only one or more insulative materials.

In some embodiments, all of the posts 26 within the staircase regions 40a and 40b may be dummy posts, and the live posts may correspond to the posts 78 (FIG. 5) along outer peripheries of the regions 12a and 12b.

The staircase contacts 82 (FIG. 5) may be formed at any suitable process stage. In some embodiments, they may be formed subsequent to the formation of the posts 26. In other embodiments, they may be formed prior to, or during, the formation of the posts 26.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a first memory region, a second memory region offset from the first memory region, and an intermediate region between the first and second memory regions. A stack extends across the first and second memory regions and the intermediate region. The stack includes alternating conductive levels and insulative levels. First channel-material-pillars are arranged within the first memory region. Second channel-material-pillars are arranged within the second memory region. Memory-block-regions extend longitudinally across the first and second memory regions and the intermediate region. Staircase regions are within the intermediate region. Each of the staircase regions laterally overlaps an associated two of the memory-block-regions. First panel regions extend longitudinally across at least portions of the staircase regions and are laterally between the associated two of the memory-block-regions. Second panel regions extend longitudinally and provide lateral separation between neighboring of the memory-block-regions. The second panel regions are of laterally different dimensions than the first panel regions and/or are compositionally different than the first panel regions.

Some embodiments include an integrated assembly comprising a first memory region, a second memory region offset from the first memory region, and an intermediate region between the first and second memory regions. A stack extends across the first and second memory regions and the intermediate region. The stack comprises alternating conductive levels and insulative levels. First channel-material-pillars are arranged within the first memory region. Second channel-material-pillars are arranged within the second memory region. Memory-block-regions extend across the first and second memory regions and the intermediate region. The memory-block-regions extend longitudinally. Each of the memory-block-regions includes a first edge region along a terminal edge of the first memory region, and includes a second edge region along a terminal edge of the second memory region. Staircase regions are within the intermediate region. Each of the staircase regions laterally overlaps an associated two of the memory-block-regions. Longitudinally-extending-panels provide lateral separation between neighboring of the memory-block-regions. The longitudinally-extending-panels include first longitudinally-extending-panels which extend across the staircase regions, and include second longitudinally-extending-panels which extend laterally between the staircase regions and not across the staircase regions, A first laterally-extending-panel is along the first edge regions, and a second laterally-extending-panel is along the second edge regions. The first longitudinally-extending-panel includes first panel regions extending entirely across the staircase regions. The second longitudinally-extending-panels include only second panel regions. The first panel regions are laterally wider than the second panel regions and/or are compositionally different than the second panel regions.

Some embodiments include a method of forming an integrated assembly. A construction is formed to include a first memory region, a second memory region laterally offset from the first memory region, and an intermediate region laterally between the first and second memory regions. Staircase locations are defined in the intermediate region. The construction includes a stack which extends across the first memory region, the second memory region and the intermediate region. The stack comprises alternating first and second levels, with the first levels comprising sacrificial material and the second levels comprising insulative material. Pillars are formed to extend through the stack within the first and second memory regions. The pillars include cell materials and channel material. First slit-openings are formed to extend through the stack, with at least one of the first slit-openings including a segment which extends across one of the staircase locations. First panel material is formed within the first slit-openings. Post-openings are formed to extend through the stack within the intermediate region. Post material is formed within the post-openings. After the first panel material and the post material are formed, second slit-openings are formed to pass through the stack. One or more of the second slit-openings extends across the first memory region, the intermediate region and the second memory region. At least some of the sacrificial material of the first levels is replaced with conductive material. Second panel material is formed within the second slit-openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming an integrated assembly, comprising:
   forming a construction to include a first memory region, a second memory region laterally offset from the first memory region, and an intermediate region laterally between the first and second memory regions; staircase locations being defined in the intermediate region; the construction including a stack extending across the first memory region, the second memory region and the intermediate region; the stack comprising alternating first and second levels, with the first levels comprising sacrificial material and the second levels comprising insulative material;
   forming pillars extending through the stack within the first and second memory regions, the pillars including cell materials and channel material;
   forming first slit-openings extending through the stack, with at least one of the first slit-openings including a segment extending across one of the staircase locations;
   forming first panel material within the first slit-openings;
   forming post-openings extending through the stack within the intermediate region;
   forming post material within the post-openings;
   after forming the first panel material and the post material, forming second slit-openings to pass through the stack; one or more of the second slit-openings extending across the first memory region, the intermediate region and the second memory region;
   replacing at least some of the sacrificial material of the first levels with conductive material; and
   forming second panel material within the second slit-openings.

2. The method of claim 1 wherein the post-openings are formed simultaneously with the first slit-openings.

3. The method of claim 1 wherein the first and second panel materials are a same composition as one another.

4. The method of claim 1 wherein the first and second panel materials are different compositions relative to one another.

5. The method of claim 4 wherein the first panel material comprises silicon dioxide.

6. The method of claim 5 wherein the second panel material comprises two or more different compositions.

7. The method of claim 6 wherein the second panel material comprises a first composition comprising silicon nitride, and a second composition consisting essentially of silicon.

8. The method of claim 1 wherein:
the first memory region includes a first outer boundary along an opposing side relative to the intermediate region;
the second memory region includes a second outer boundary along an opposing side relative to the intermediate region; and
some of the first slit-openings are formed to extend along the first and second outer boundaries.

9. The method of claim 1 wherein:
the first memory region includes a first outer boundary along an opposing side relative to the intermediate region;
the second memory region includes a second outer boundary along an opposing side relative to the intermediate region; and
some of the second slit-openings are formed to extend along the first and second outer boundaries.

10. The method of claim 1 wherein the second slit-openings extend along a longitudinal direction, and wherein the first slit-openings are laterally at least as wide as the second slit-openings.

11. The method of claim 1 wherein the second slit-openings extend along a longitudinal direction, and wherein the first slit-openings are laterally wider than the second slit-openings.

12. The method of claim 1 wherein at least one of the second slit-openings has an edge directly against the first panel material.

13. The method of claim 1 wherein the first and second slit-openings laterally separate memory-block-regions from one another.

14. A method of forming an integrated assembly, comprising:
forming a first memory region, a second memory region offset from the first memory region, and an intermediate region between the first and second memory regions;
forming a stack extending across the first and second memory regions and the intermediate region, the stack comprising alternating conductive levels and insulative levels;
forming channel-material-pillars arranged within the first and second memory regions;
forming memory-block-regions extending longitudinally across the first and second memory regions and the intermediate region;
forming staircase regions within the intermediate region, each of the staircase regions laterally overlapping an associated two of the memory-block-regions;
forming first panel regions extending longitudinally across at least portions of the staircase regions and being laterally between the associated two of the memory-block-regions; and
forming second panel regions extending longitudinally and providing lateral separation between neighboring of the memory-block-regions, the second panel regions being of laterally different dimensions than the first panel regions and/or being compositionally different than the first panel regions.

15. The method of claim 14 wherein the first panel regions are laterally thicker than the second panel regions.

16. The method of claim 15 wherein an edge of one of the first panel regions abuts to an edge of one of the second panel regions.

17. The method of claim 14 wherein the second panel regions are compositionally different from the first panel regions.

18. The method of claim 14 further comprising forming posts within the intermediate region.

19. A method of forming integrated assembly, comprising:
forming a first memory region, a second memory region offset from the first memory region, and an intermediate region between the first and second memory regions;
forming a stack extending across the first and second memory regions and the intermediate region, the stack comprising alternating conductive levels and insulative levels;
forming first channel-material-pillars arranged within the first memory region;
forming second channel-material-pillars arranged within the second memory region;
forming memory-block-regions extending across the first and second memory regions and the intermediate region, the memory-block-regions extending longitudinally; each of the memory-block-regions including a first edge region along a terminal edge of the first memory region, and including a second edge region along a terminal edge of the second memory region;
forming staircase regions within the intermediate region, each of the staircase regions laterally overlapping an associated two of the memory-block-regions;
forming longitudinally-extending-panels providing lateral separation between neighboring of the memory-block-regions; the longitudinally-extending-panels including first longitudinally-extending-panels which extend across the staircase regions and including second longitudinally-extending-panels that extend laterally between the staircase regions and not across the staircase regions; and
forming a first laterally-extending-panel along the first edge regions and a second laterally-extending-panel along the second edge regions; wherein:
the first longitudinally-extending-panels include first panel regions extending entirely across the staircase regions;
the second longitudinally-extending-panels include only second panel regions; and
the first panel regions are laterally wider than the second panel regions and/or being compositionally different than the second panel regions.

20. The method of claim 19 wherein the first panel regions comprise only a single homogenous material, and wherein the second panel regions comprise a laminate of two or more different materials.

* * * * *